(12) United States Patent
Xie et al.

(10) Patent No.: US 12,733,252 B2
(45) Date of Patent: Sep. 8, 2026

(54) GATE CONTACTS FOR SEMICONDUCTOR DEVICES

(71) Applicant: International Business Machines Corporation, Armonk, NY (US)

(72) Inventors: Ruilong Xie, Niskayuna, NY (US); Albert M. Chu, Nashua, NH (US); Dureseti Chidambarrao, Weston, CT (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 18/129,066

(22) Filed: Mar. 30, 2023

(65) Prior Publication Data

US 2024/0332293 A1 Oct. 3, 2024

(51) Int. Cl.
*H10D 30/67* (2025.01)
*H10D 30/01* (2025.01)
(Continued)

(52) U.S. Cl.
CPC .......... *H10D 84/85* (2025.01); *H10D 30/014* (2025.01); *H10D 30/43* (2025.01);
(Continued)

(58) Field of Classification Search
CPC .. H10D 30/014; H10D 30/43; H10D 30/6729; H10D 30/6735; H10D 30/6757; H10D 62/121; H10D 64/01326; H10D 84/85; H10D 84/0167; H10D 84/0172; H10D 84/0186; H10D 84/0188; H10D 84/038; H10D 84/0149; H10D 84/83; H10W 20/0698; H10W 20/20; H10W 20/427; H10W 20/069
See application file for complete search history.

(56) References Cited

U.S. PATENT DOCUMENTS 8,871,593 B1 * 10/2014 Siemieniec .......... H10D 12/038
438/176
2021/0011115 A1 1/2021 Obiagwu
(Continued)

FOREIGN PATENT DOCUMENTS

EP 4002452 A 5/2022

OTHER PUBLICATIONS

A. Gupta et al., "Buried Power Rail Scaling and Metal Assessment for the 3 nm Node and Beyond". Conference Paper Dec. 2020. pp. 4.

*Primary Examiner* — Omar F Mojaddedi
(74) *Attorney, Agent, or Firm* — Seed Intellectual Property Law Group LLP

(57) ABSTRACT

A gate contact is formed within a gate cut region of a semiconductor structure to facilitate electrical routing. The gate contact includes a bottom portion extending within the gate cut region and adjoining a vertical end portion of a metal gate. A metal layer on the front side of the semiconductor structure includes signal tracks, one or more of which is vertically above the gate cut region. A signal track in the metal layer may be electrically connected to the gate contact. Selected source/drain regions within the semiconductor structure may be electrically connected to a back side power delivery network.

20 Claims, 14 Drawing Sheets

(51) Int. Cl.

| | |
|---|---|
| ***H10D 30/43*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10W 20/00*** | (2026.01) |
| ***H10W 20/20*** | (2026.01) |
| ***H10W 20/41*** | (2026.01) |

(52) U.S. Cl.

CPC ..... *H10D 30/6729* (2025.01); *H10D 30/6735* (2025.01); *H10D 62/121* (2025.01); *H10D 64/01326* (2026.01); *H10D 84/0167* (2025.01); *H10D 84/0172* (2025.01); *H10D 84/0186* (2025.01); *H10D 84/0188* (2025.01); *H10D 84/038* (2025.01); *H10W 20/0698* (2026.01); *H10W 20/20* (2026.01); *H10W 20/427* (2026.01)

(56) References Cited

U.S. PATENT DOCUMENTS

| | | | | |
|---|---|---|---|---|
| 2021/0020385 | A1 | 1/2021 | Nishita | |
| 2021/0134721 | A1 | 5/2021 | Chiang | |
| 2021/0273075 | A1* | 9/2021 | Pan | H10D 84/038 |
| 2021/0305252 | A1 | 9/2021 | Chiang | |
| 2021/0305381 | A1 | 9/2021 | Chiang | |
| 2021/0351303 | A1 | 11/2021 | Ju | |
| 2021/0376071 | A1 | 12/2021 | Liu | |
| 2021/0376093 | A1 | 12/2021 | Chu | |
| 2022/0037496 | A1 | 2/2022 | Chen | |
| 2022/0238370 | A1 | 7/2022 | Chen | |
| 2022/0262791 | A1 | 8/2022 | Shi | |
| 2022/0277985 | A1 | 9/2022 | Huang | |
| 2023/0253257 | A1* | 8/2023 | Su | H10D 62/115 257/288 |
| 2024/0128267 | A1* | 4/2024 | Liang | H10D 84/038 |

* cited by examiner

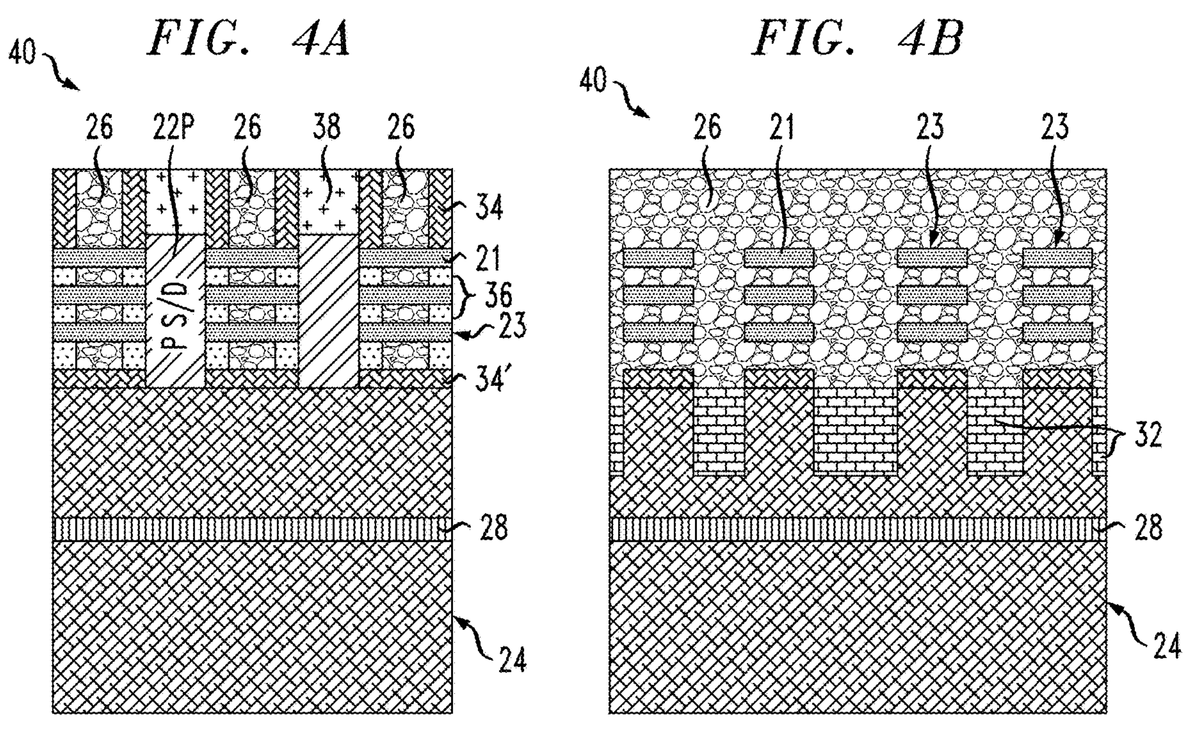
FIG. 4A
40
26
22P
26
38
26
34
21
36
23
P S/D
34'
28
24
FIG. 4B
40
26
21
23
23
32
28
24
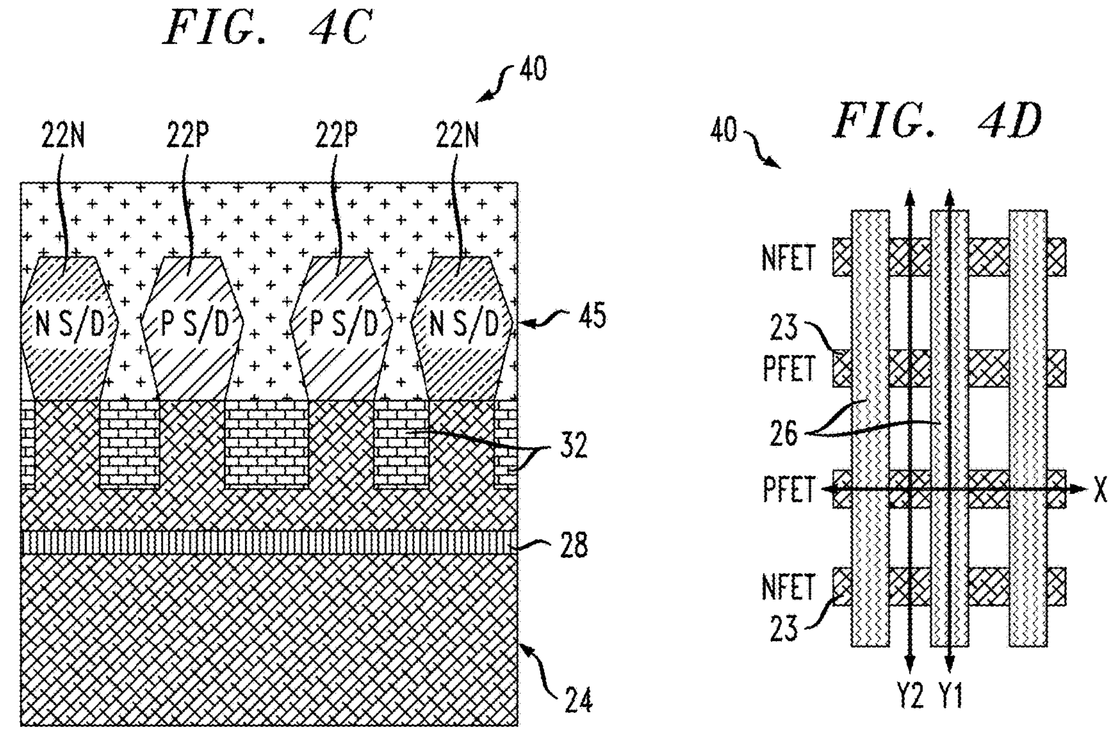
FIG. 4C
40
22N
22P
22P
22N
N S/D
P S/D
P S/D
N S/D
45
32
28
24
FIG. 4D
40
NFET
23
PFET
26
PFET
X
NFET
23
Y2
Y1

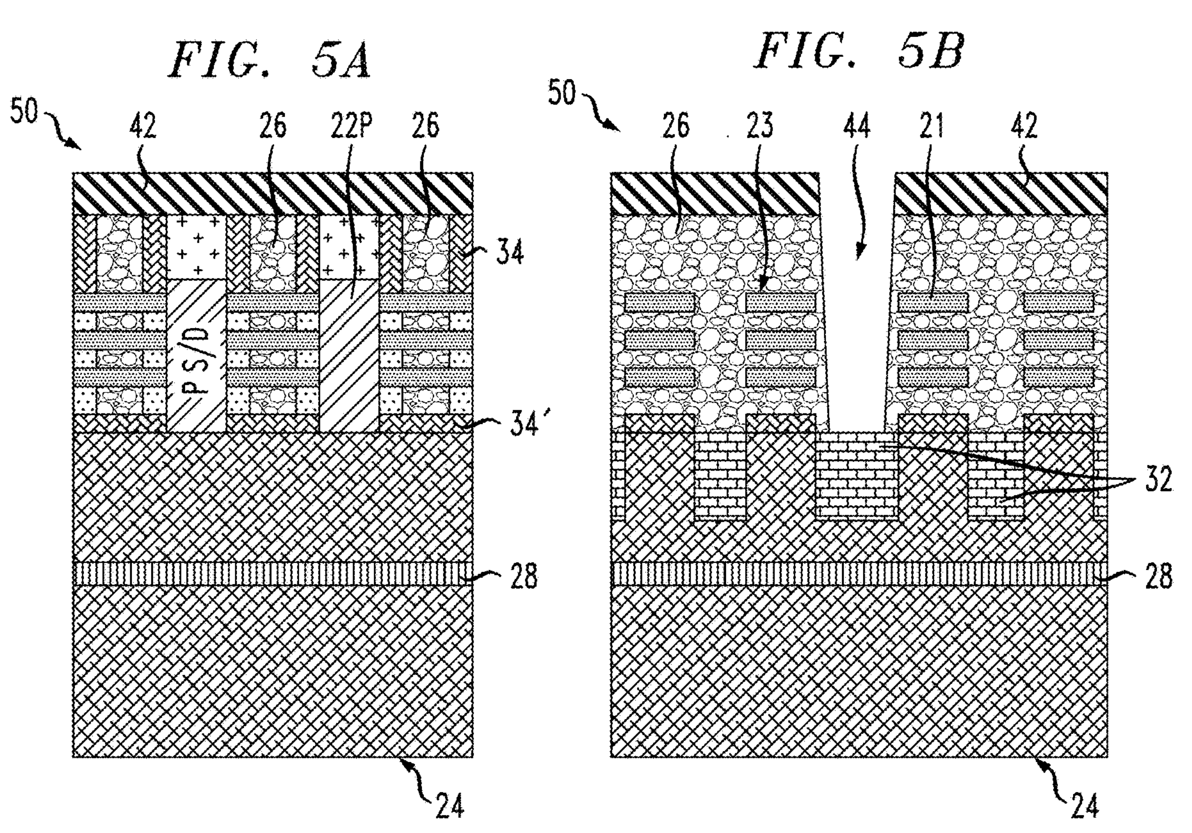
FIG. 5A
50
42
26
22P
26
34
P S/D
34′
28
24
FIG. 5B
50
26
23
44
21
42
32
28
24
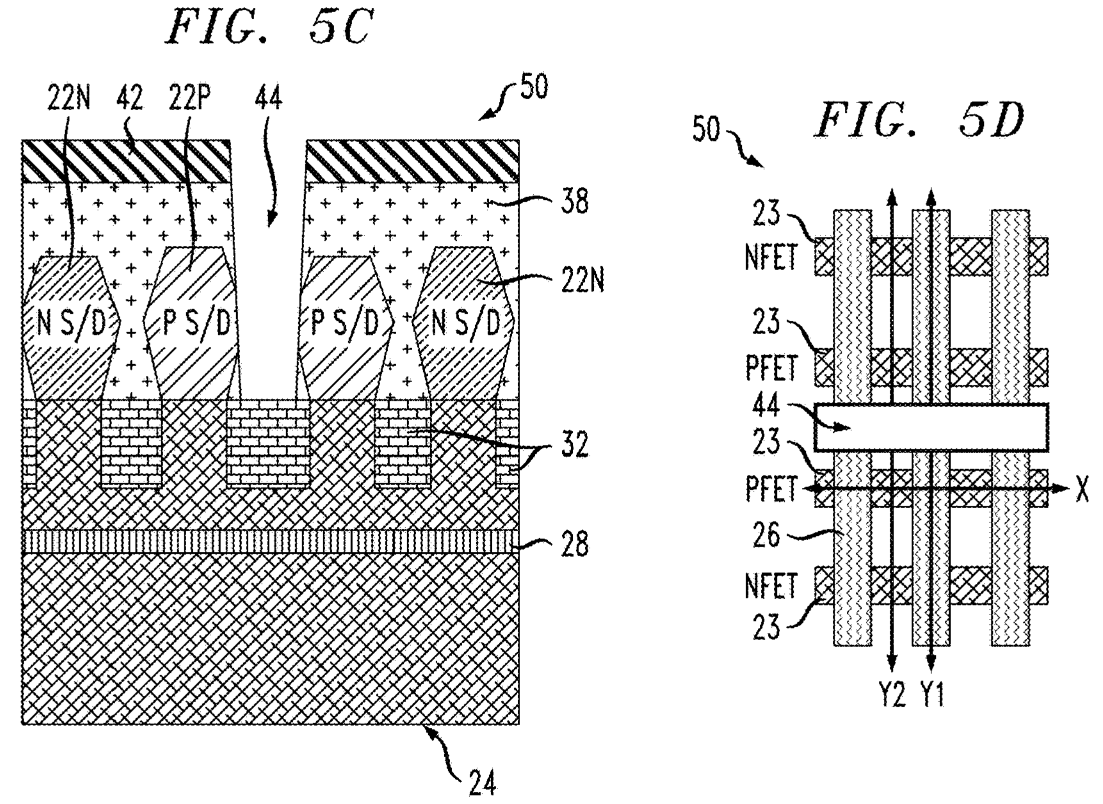
FIG. 5C
22N
42
22P
44
50
38
N S/D
P S/D
P S/D
N S/D
22N
32
28
24
FIG. 5D
50
23
NFET
23
PFET
44
23
PFET
X
26
NFET
23
Y2
Y1

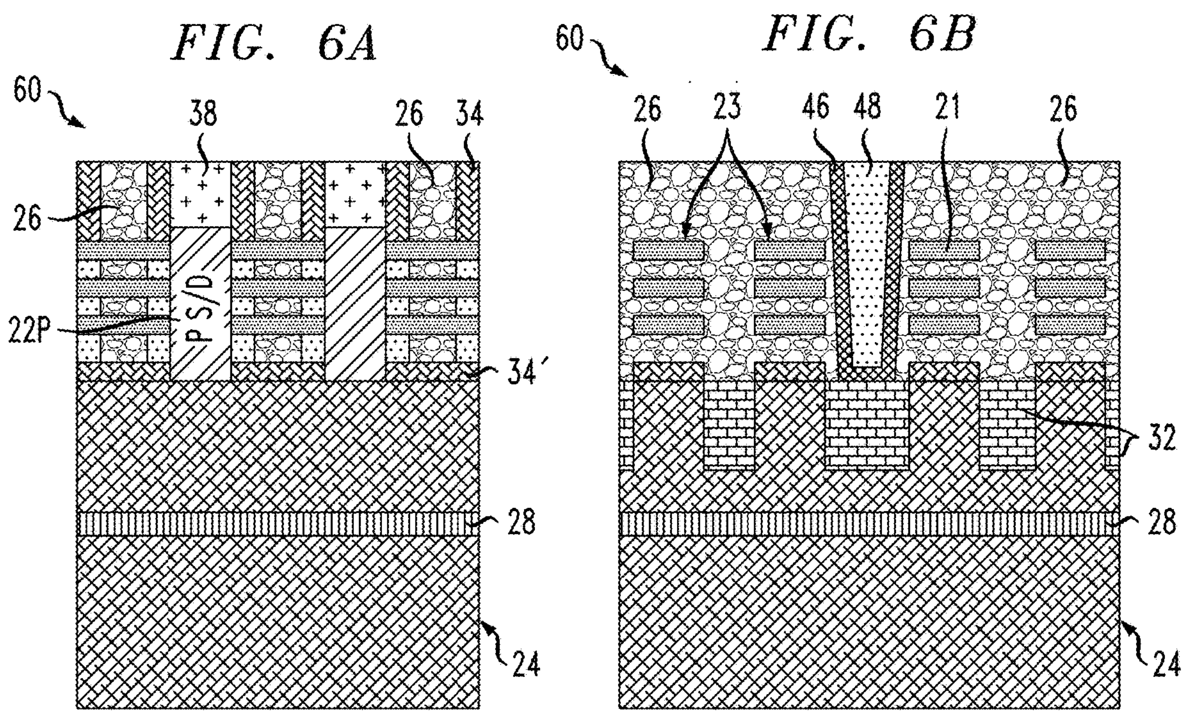
FIG. 6A
60
38
26
34
26
22P
P S/D
34′
28
24
FIG. 6B
60
26
23
46
48
21
26
32
28
24
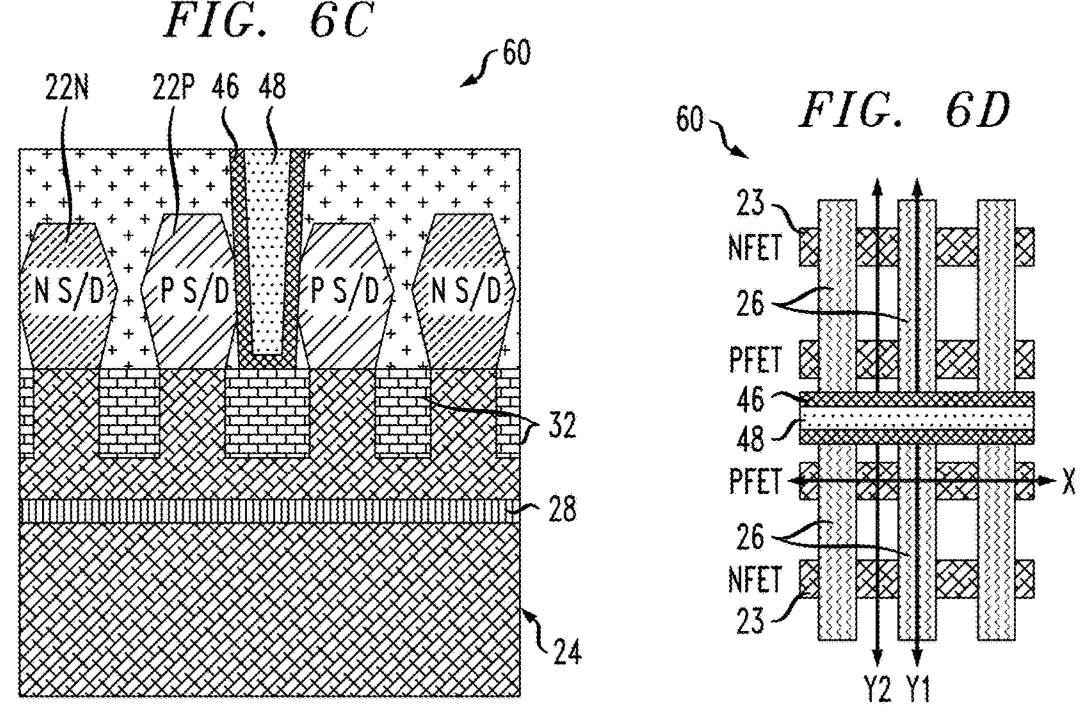
FIG. 6C
60
22N
22P
46
48
N S/D
P S/D
P S/D
N S/D
32
28
24
FIG. 6D
60
23
NFET
26
PFET
46
48
PFET
X
26
NFET
23
Y2
Y1

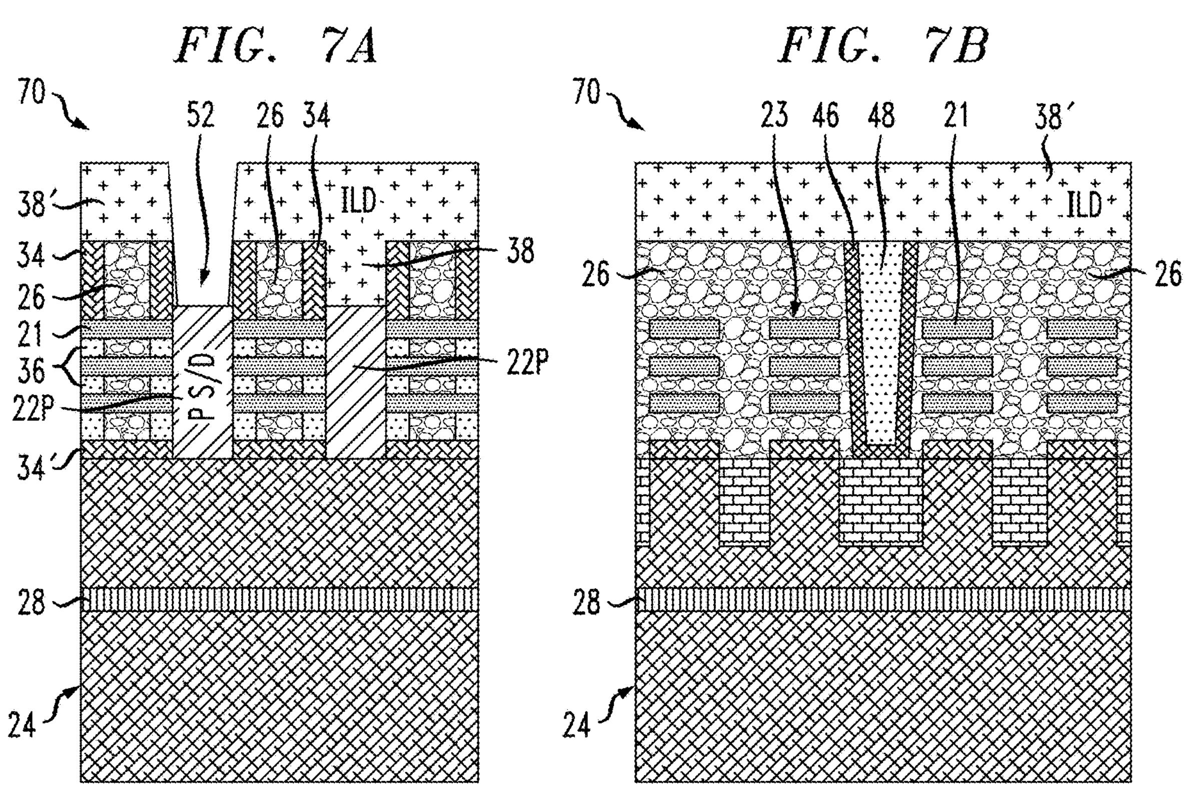
FIG. 7A
70
52
26
34
38′
ILD
34
26
38
21
36
22P
22P
P S/D
34′
28
24
FIG. 7B
70
23
46
48
21
38′
ILD
26
26
28
24
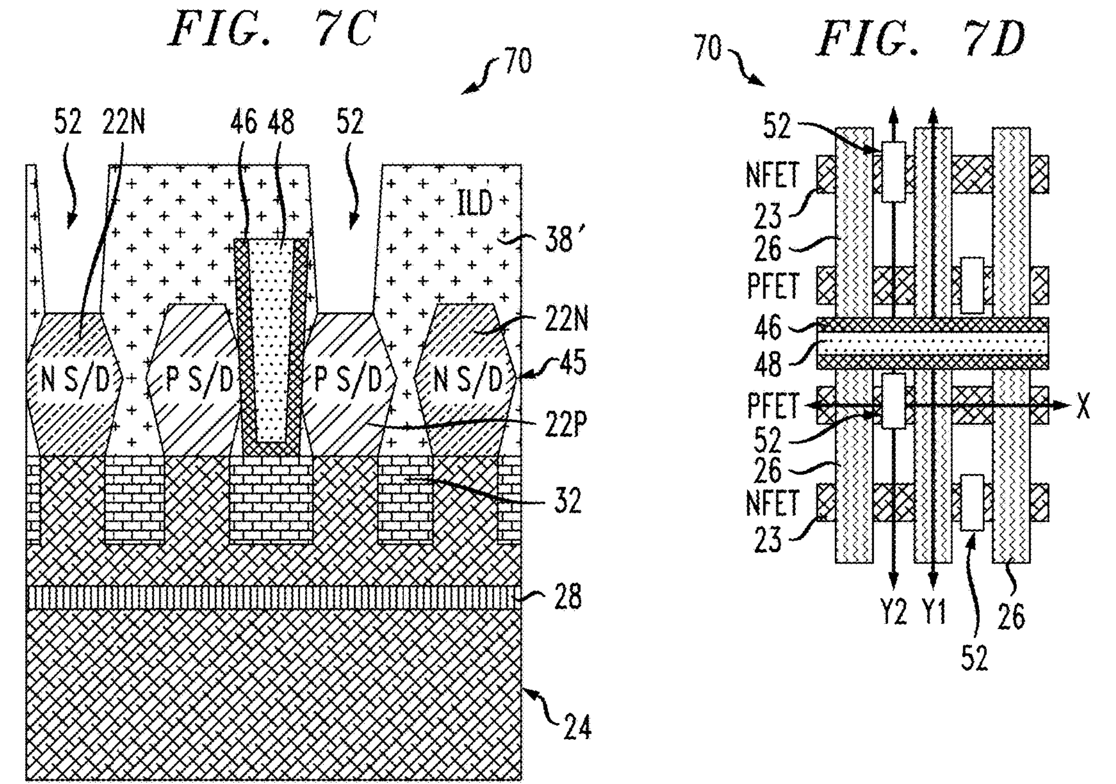
FIG. 7C
70
52
22N
46
48
52
ILD
38′
22N
N S/D
P S/D
P S/D
N S/D
45
22P
32
28
24
FIG. 7D
70
52
NFET
23
26
PFET
46
48
PFET
X
52
26
NFET
23
Y2
Y1
26
52

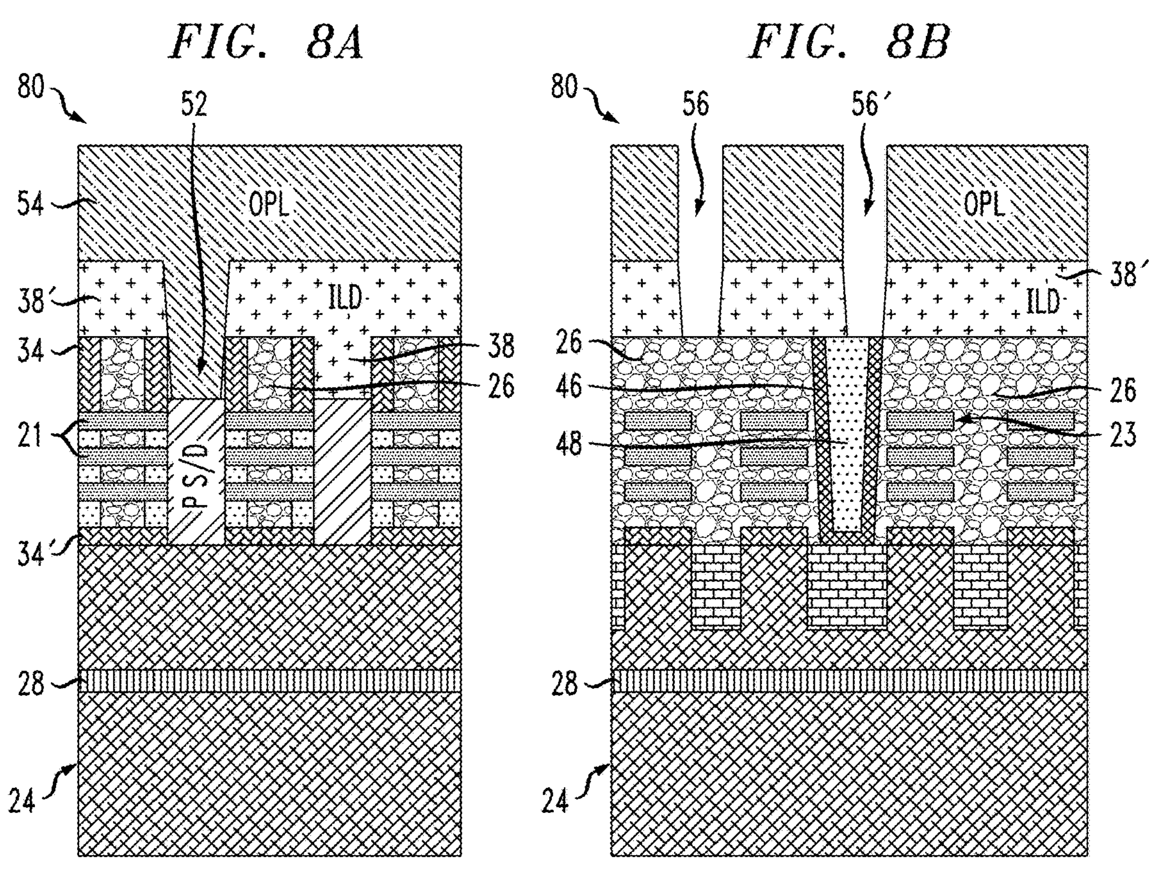
FIG. 8A
80
52
54
OPL
38′
ILD
34
38
26
21
P S/D
34′
28
24
FIG. 8B
80
56
56′
OPL
38′
ILD
26
46
26
23
48
28
24
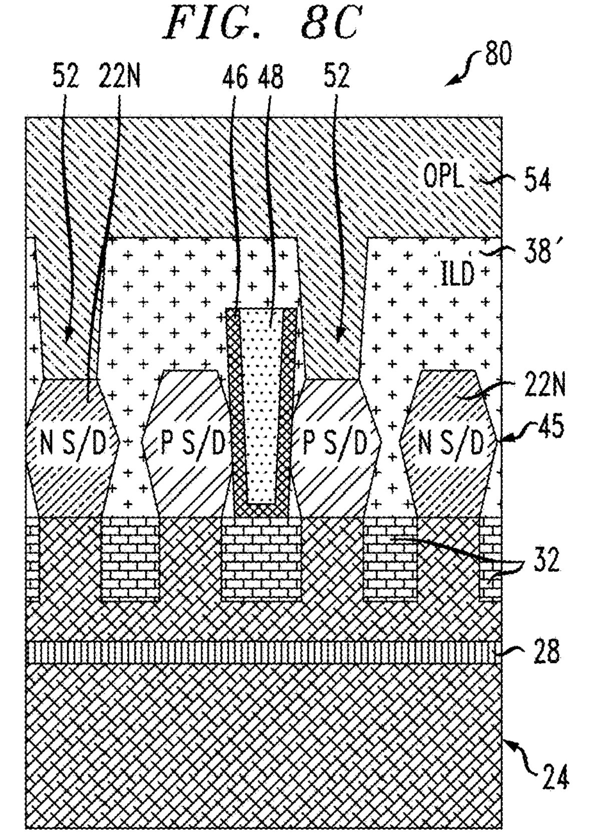
FIG. 8C
80
52
22N
46
48
52
OPL
54
38′
ILD
22N
N S/D
P S/D
P S/D
N S/D
45
32
28
24
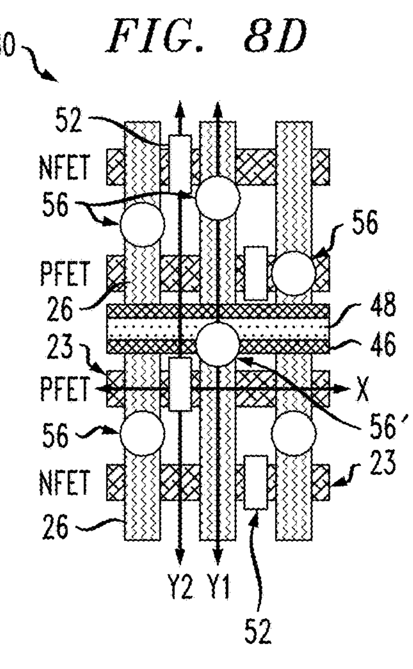
FIG. 8D
80
52
NFET
56
56
PFET
26
48
23
46
PFET
X
56
56′
23
NFET
26
Y2
Y1
52

90
54
38´
34
26
21
34´
28
24
52
26
38
OPL
ILD
P S/D 90
56
56´
46
48
28
24
38´
26´
26
23
OPL
ILD 90
52
46 48
52
54
38´
22N
45
32
22N
28
24
OPL
ILD
N S/D
P S/D
P S/D
N S/D

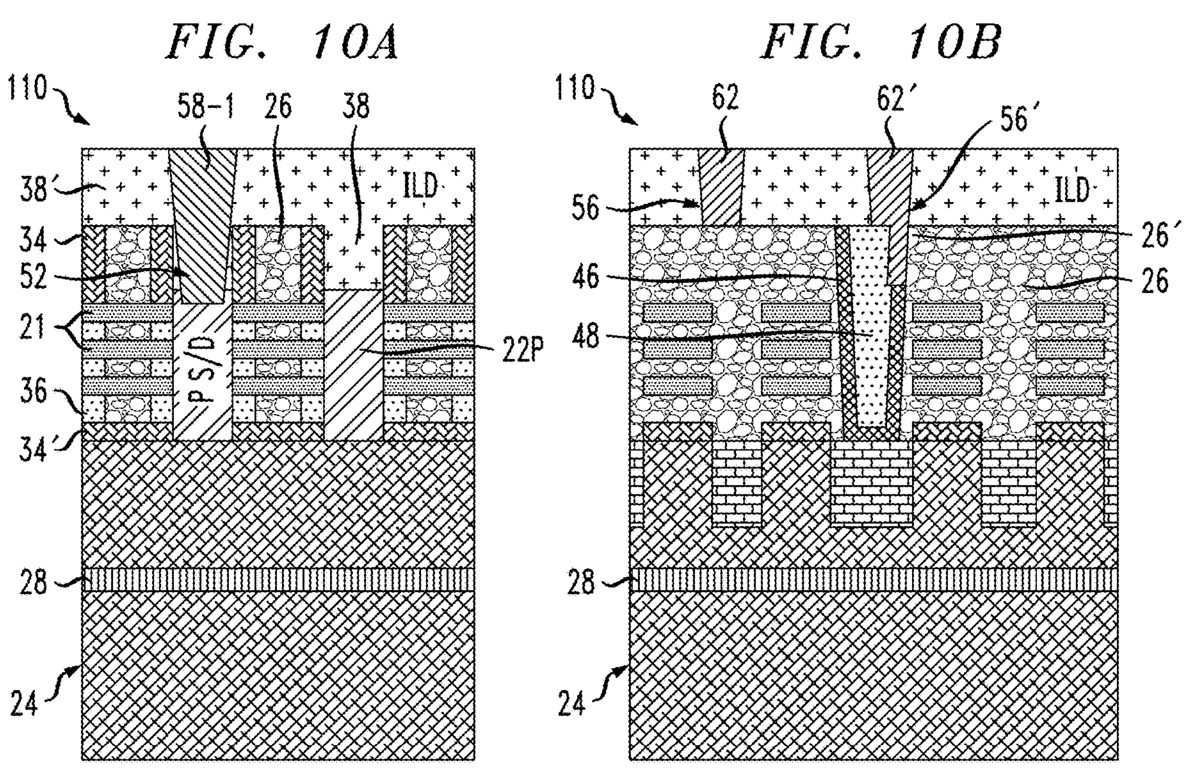
FIG. 10A
110
58-1
26
38
38′
ILD
34
52
21
PS/D
22P
36
34′
28
24
FIG. 10B
110
62
62′
56′
56
ILD
26′
46
26
48
28
24
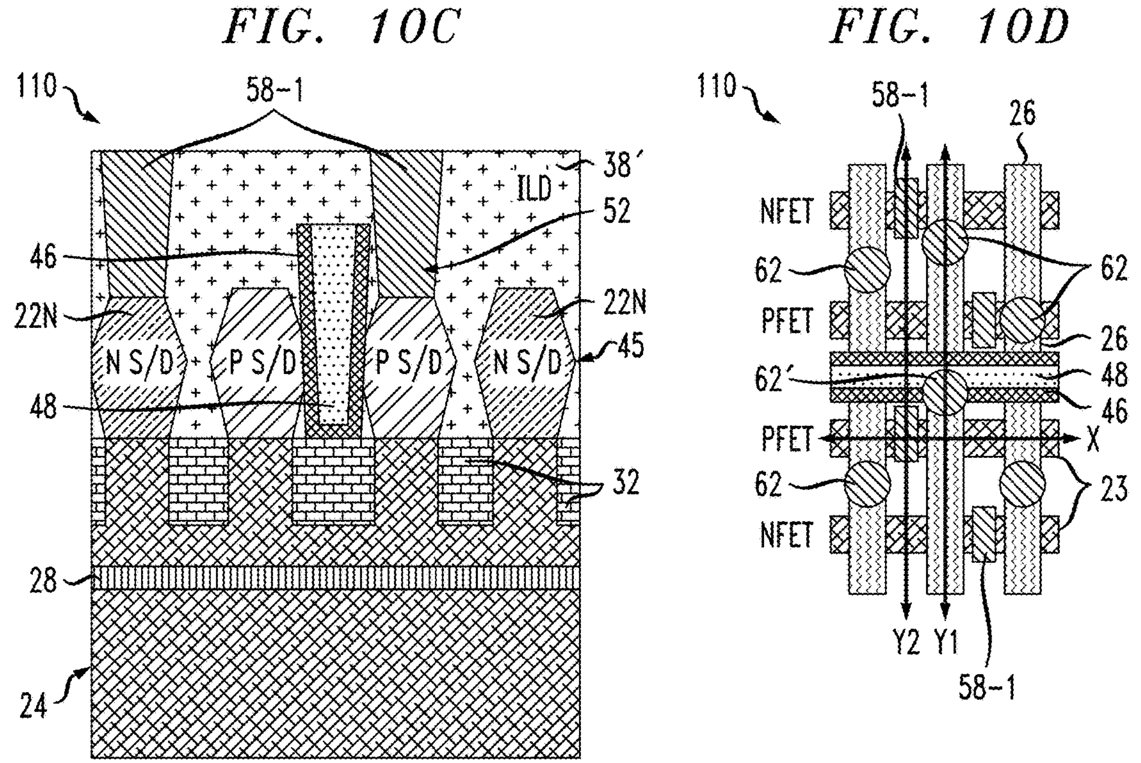
FIG. 10C
110
58-1
38′
ILD
52
46
22N
22N
N S/D
P S/D
P S/D
N S/D
45
48
32
28
24
FIG. 10D
110
58-1
26
NFET
62
62
PFET
26
62′
48
46
PFET
X
62
23
NFET
Y2
Y1
58-1

111
64
38´
58-1
34
21
36
34´
28
24
VO
M1
ILD
26
38
22P
P S/D 111
62
64
VO
M1
46
62´
26´
26
ILD
28
24

111
58-1
46
48
58-1
VO
M1
ILD
64
38´
22P
45
32
N S/D
P S/D
P S/D
N S/D
22N
28
24

CARRIER WAFER
BEOL
M1
ILD
V0
P S/D
N S/D
112
66
64
65
34
21
36
34´
28
24
22P
22N
45
32
38´
58-1
62
62´

65
64
114
66
58-1
CARRIER WAFER
BEOL
M1
V0
ILD
38′
45
32
N S/D
P S/D
22N
22P
46

62′
62
34′

23
21
36
34

CARRIER WAFER
BEOL
M1
V0
ILD
P S/D
N S/D
115
66
65
64
58-1
34
21
36
34'
38''
22P
23
62
62'
46
26
32
38'
38
45

116
66
65
CARRIER WAFER
BEOL
M1
ILD
V0
P S/D
BSPDN
64
58-1
34
21
36
34'
38"
75
26
58-2

116
66
65
64
CARRIER WAFER
BEOL
M1
ILD
V0
BSPDN
62
62'
26
34'
38"
46
32
75

116
66
65
64
CARRIER WAFER
BEOL
M1
ILD
V0
N S/D
P S/D
BSPDN
38'
46
22N
45
22P
32
58-1
48
58-2
75

GATE CONTACTS FOR SEMICONDUCTOR DEVICES

BACKGROUND

The present invention relates generally to the electrical, electronic and computer arts and, more particularly, to FET architectures having gate contacts and methods for forming such gate contacts.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming gate-all-around (GAA) structures. Epitaxial regions on the ends of the nanosheet channel layers form source/drain regions of the nanosheet FETs.

The use of both frontside contacts and backside contacts can facilitate the fabrication and performance of integrated circuits. By providing contacts on both sides of a chip, contact spacing can be greater than if only one side (for example, the front side) includes all contacts for the FETs. Backside power rails can be electrically connected to backside source/drain contacts.

BRIEF SUMMARY

In a first aspect of the invention, a monolithic semiconductor structure includes a device layer. The device layer includes a first field-effect transistor having a channel region and a gate stack adjoining the channel region. The gate stack includes a metal gate portion and a gate dielectric layer between the metal gate portion and the channel region. The first field-effect transistor further includes source/drain regions extending from the channel region. A gate cut region includes a first vertical side wall and a second vertical side wall in opposing relation to the first vertical side wall. The first vertical side wall includes an end portion of the metal gate portion of the first field-effect transistor while the second vertical side wall includes an end portion of a second gate metal portion of a second field-effect transistor. Dielectric material within the gate cut region adjoins the first vertical side wall and the second vertical side wall of the gate cut region. A gate contact having a bottom portion extends within the gate cut region and is positioned between the first vertical side wall of the gate cut region and the dielectric material. The bottom portion of the gate contact is in direct contact with the metal gate portion of the first field-effect transistor. The gate contact further includes a top portion extending above the gate stack.

A monolithic semiconductor structure in accordance with a further aspect includes a device layer having a front side and a back side. The device layer includes field-effect transistors within a front side interlevel dielectric layer, each of the field-effect transistors including a channel region, a gate stack adjoining the channel region, and first and second source/drain regions extending laterally from the channel region. A gate cut region extends between a first gate stack of a first one of the field-effect transistors and a second gate stack of a second one of the field-effect transistors. A dielectric fill within the gate cut region includes a first dielectric compound. A dielectric liner within the gate cut region adjoin the first gate stack, the second gate stack, and the dielectric fill. The dielectric liner includes a second dielectric compound having a different composition than the first dielectric compound. A back-end-of-line interconnect layer over the front side of the device layer is electrically connected to the device layer. A metal layer between the device layer and the back-end-of-line interconnect layer includes signal tracks within a middle-of-line interlevel dielectric layer. A gate contact electrically connects one of the first gate stack and the second gate stack to a first signal track within the metal layer. The gate contact includes a bottom portion extending within the gate cut region and directly contacting one of the first gate stack and the second gate stack. The bottom portion of the gate contact is positioned between a vertical side wall of the one of the first gate stack and the second gate stack and the dielectric fill and adjoins a top surface of the dielectric liner. A top portion of the gate contact extends vertically from the bottom portion and is electrically connected to the first signal track.

A method of method of forming a gate contact for a field-effect transistor is provided in accordance with a further aspect of the invention. The method includes obtaining a device layer comprising a plurality of transistor channel regions and a gate stack extending across the transistor channel regions, the gate stack including a metal gate portion and a gate dielectric layer between the metal gate portion and the transistor channel regions. A gate cut trench is formed through the gate stack. A dielectric liner is formed within the gate cut trench and a dielectric fill is formed within the gate cut trench over the dielectric liner. A middle-of-line interlevel dielectric layer is formed over the device layer and patterned, thereby forming a gate contact opening over a portion of the gate cut region. The method further includes selectively recessing the dielectric liner with respect to the dielectric fill, thereby exposing a vertical end portion of the gate stack and forming a space extending downwardly from the gate contact opening and between the dielectric fill and the vertical end portion of the gate stack. The gate contact opening and the downwardly extending space are filled with contact metal.

Techniques and structures as disclosed herein can provide substantial beneficial technical effects. Some embodiments may not have these potential advantages and these potential advantages are not necessarily required of all embodiments. By way of example only and without limitation, one or more embodiments may provide one or more of the following advantages:

Improved contact routability;

Benefits of backside power delivery network technology;

M1 power rails unnecessary at cell boundaries;

Signal routing tracks at cell boundaries for gate signals.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 4A is a schematic, cross-sectional view showing taken along section line X of FIG. 4D, showing a semiconductor structure including n-type and p-type nanosheet transistors;

FIG. 4B is a schematic, cross-sectional view thereof taken along section line Y1 of FIG. 4D;

FIG. 4C is a schematic, cross-sectional view thereof taken along section line Y2 of FIG. 4D;

FIG. 4D is a top plan view thereof;

FIG. 5A is a schematic, cross-sectional view thereof taken along section line X of FIG. 5D following hard mask deposition and gate cut;

FIG. 5B is a schematic, cross-sectional view thereof taken along section line Y1 of FIG. 5D;

FIG. 5C is a schematic, cross-sectional view thereof taken along section line Y2 of FIG. 5D;

FIG. 5D is a top plan view thereof;

FIG. 6A is a schematic, cross-sectional view thereof taken along section line X of FIG. 6D following deposition of a dielectric liner and a dielectric fill layer and planarization of the resulting structure;

FIG. 6B is a schematic, cross-sectional view thereof taken along section line Y1 of FIG. 6D;

FIG. 6C is a schematic, cross-sectional view thereof taken along section line Y2 of FIG. 6D;

FIG. 6D is a top plan view thereof;

FIG. 7A is a schematic, cross-sectional view thereof taken along section line X of FIG. 7D following deposition of a middle-of-line (MOL) fill layer and source/drain contact patterning thereof;

FIG. 7B is a schematic, cross-sectional view thereof taken along section line Y1 of FIG. 7D;

FIG. 7C is a schematic, cross-sectional view thereof taken along section line Y2 of FIG. 7D;

FIG. 7D is a top plan view thereof;

FIG. 8A is a schematic, cross-sectional view thereof taken along section line X of FIG. 8D following deposition of an organic planarization layer and gate contact patterning thereof;

FIG. 8B is a schematic, cross-sectional view thereof, taken along section line Y1 of FIG. 8D;

FIG. 8C is a schematic, cross-sectional view thereof taken along section line Y2 of FIG. 8D;

FIG. 8D is a top plan view thereof;

FIG. 10A is a schematic, cross-sectional view thereof taken along the X cross section of the structure shown in FIG. 10D, following removal of the organic planarization layer and contact metallization;

FIG. 10B is a schematic, cross-sectional view thereof, taken along section line Y1 of the structure shown in FIG. 10D;

FIG. 10C is a schematic, cross-sectional view thereof, taken along section line Y2 of the structure shown in FIG. 10D;

FIG. 10D is a top plan view thereof;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The use of backside contacts in addition to frontside contacts may facilitate the manufacture and performance of integrated circuits, particularly those including relatively small elements and increased packing density. Gate-all-around (GAA) transistors such as nanosheet transistors and fin-like field effect transistors (FinFETs) are among the elements employed in high-density, high-performance applications. Contacts as disclosed herein may be employed in association with either nanosheet or FinFET transistors.

Figure 3:
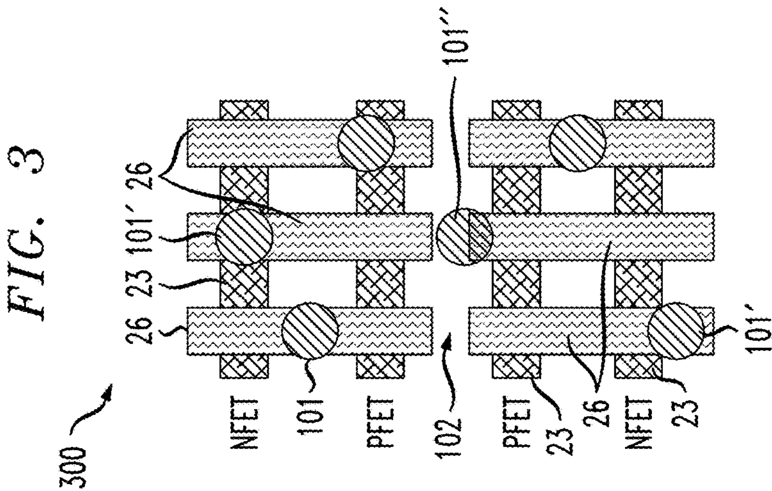
FIG. 3 is a schematic, top plan view of a semiconductor structure including gate contacts, including a gate contact formed over an edge of a metal gate.
Figure 2:
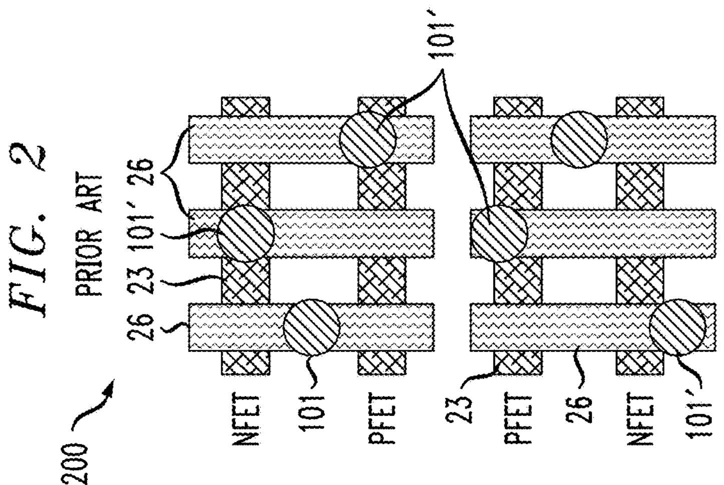
FIG. 2 is a schematic, top plan view of a prior art semiconductor structure including gate contacts formed over cell boundaries and overlapping active regions thereof.
Figure 1:
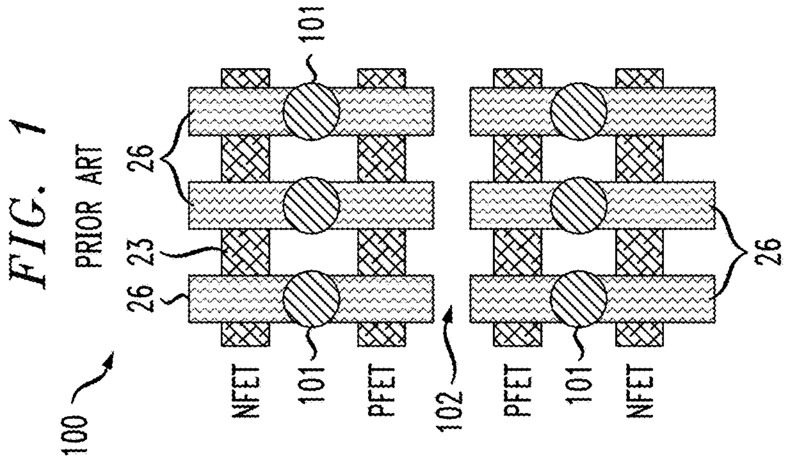
FIG. 1 is a schematic, top plan view of a prior art semiconductor structure including gate contacts formed only over cell boundaries.

The formation of gate contacts at the interface between gate edge portions and gate cut regions is particularly useful for devices including backside power delivery networks as it allows the M1 tracks over the cell boundary to be employed for signal routing. Referring to FIG. 1, a simplified top plan view illustrates a semiconductor structure 100 including active regions comprising nFET and pFET transistors electrically isolated by a gate cut region 102. Vertical structures 23 comprising semiconductor channel regions extend perpendicularly with respect to gate stacks 26 of the nFET and pFET transistors. In this prior art structure, gate contacts 101 are formed only over shallow trench isolation (STI) regions (not shown). Referring to FIG. 2, some gate contacts 101 of an alternative semiconductor structure 200 are formed over STI regions (not shown) while other gate contacts 101' overlap the active regions of the alternative semiconductor structure 200. Wire routing is facilitated by this placement of gate contacts as compared to that shown in FIG. 1. In accordance with one or more embodiments of the invention, gate contacts 101" are formed within gate contact openings that extend to the interface between metal gate ends and a gate cut region 102. A semiconductor structure 300 in accordance with an exemplary embodiment of the invention is shown in FIG. 3. The exemplary semiconductor structure 300 includes gate contacts 101, 101' and 101" formed in various locations to facilitate later wiring of the integrated circuits comprising each cell, including a gate contact 101" that extends within a gate cut region 102.

An exemplary sequence of steps that may be employed for the fabrication of integrated circuits including frontside and backside contacts is shown in FIG. 4A, FIG. 4B, FIG. 4C, FIG. 4D and subsequent sets of figures. An exemplary, partially completed monolithic semiconductor structure 40 is shown in FIG. 4A, FIG. 4B, FIG. 4C and FIG. 4D. The monolithic semiconductor structure 40 includes nFET and pFET nanosheet transistors, each comprising a stack of semiconductor channel layers 21, an uncut gate stack 26, and source/drain regions 22N, 22P, all formed over a substrate. An exemplary substrate includes a silicon substrate layer 24 and an etch stop layer 28 within the silicon substrate layer 24. The etch stop layer can be, for example, a buried oxide (BOX) layer or a silicon germanium layer. Methods of fabricating nanosheet transistors are known to the art and continue to be developed. An exemplary method for obtaining the exemplary semiconductor structure 40 is described below, it being appreciated that other techniques may be employed for obtaining such a structure or similar structures that would benefit from the inventions disclosed herein.

In one or more exemplary embodiments, the semiconductor channel layers 21 each have a thickness in the range of four to ten nanometers (4-10 nm). The number of semiconductor (channel) layers in the vertical stack may vary depending on the desired uses and capabilities of the nanosheet transistors to be fabricated. The semiconductor channel layers 21 are essentially monocrystalline silicon layers and are spaced ten to twenty nanometers (10-20 nm) apart in some embodiments. The dimensions of the semiconductor channel layers and the vertical spacing of channel layers should be considered exemplary as opposed to limiting.

The vertical nanosheet stacks depicted in FIG. 4A, FIG. 4B and FIG. 4C can be obtained by epitaxially growing silicon and sacrificial silicon germanium layers, respectively, on a semiconductor substrate in alternating sequence to obtain a layered stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The sacrificial silicon germanium layers are replaced later in the process by metal gate and gate dielectric materials that comprise the gate stacks 26 shown in the figures. The sacrificial silicon germanium layers may have the composition $Si_{1-x}Ge_x$ where x is between 0.2 and 0.3 to allow selective etching with respect to silicon. In one exemplary embodiment, the sacrificial silicon germanium layers and the etch stop layer 28 have the composition $Si_{1-x}Ge_x$ where x is about 0.3. Active region patterning is performed to define nFET to nFET or pFET to pFET space and obtain a multi-layer, finned semiconductor structure. Fin-like nanosheet stacks are obtained, each including silicon channel layers and sacrificial silicon germanium layers. The width of each semiconductor channel layer 21 in the top, fin-like portions of an exemplary monolithic structure is fifteen nanometers (15 nm) or greater in some embodiments. Shallow trench isolation (STI) regions 32 extend within the substrate 24 and electrically isolate selected regions of the structure. The bottom ends of the STI regions are at or above the etch stop layer 28.

A sacrificial gate layer (not shown) is formed over the stacks of nanosheet layers. The sacrificial gate layer may comprise, for example, a thin layer of $SiO_2$ and amorphous silicon (a-Si) or polycrystalline silicon (polysilicon). Sacrificial gate material used to form the sacrificial gate layer may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. A hard mask (for example, SiNx or a combination of SiNx and $SiO_2$) is deposited and patterned on the top surface of the sacrificial gate layer. The sacrificial gate layer is then subjected to a reactive ion etch. The resulting structure includes sacrificial gates that extend perpendicularly with respect to the parallel nanosheet stacks.

Spaces are formed between the semiconductor substrate layer 24 and the nanosheet stacks. The top substrate layer (not shown) may comprise a silicon germanium layer having a higher germanium content than the sacrificial silicon germanium layers within the nanosheet stacks and can therefore be etched selectively with respect to such layers. A selective etching process such as dry HCl etch can be employed to remove the top substrate layer selective to the silicon channel layers 21 as well as the sacrificial silicon germanium layers. A dielectric layer is deposited over the resulting structure and fills the spaces beneath the nanosheet stacks. Dielectric gate spacers 34 formed in the spaces and adjoining the sacrificial gates (not shown) may comprise, for example, SiN, SiBCN, SiOCN and/or SiCO, or other suitable dielectric materials. Such materials can be deposited using ALD (atomic layer deposition). In an exemplary embodiment, silicon nitride is formed on the monolithic structure. The silicon nitride layer is selectively etched back to remove unprotected horizontal portions thereof. The spacer material beneath the nanosheet stacks is protected and remains within the spaces following etch-back, thereby also forming bottom dielectric isolation (BDI) layers 34' as illustrated in FIG. 4A and FIG. 4B.

The portions of the nanosheet stacks outside the regions protected by the sacrificial gate, hard mask and gate spacers 34 are subjected to a reactive ion etch down to the bottom dielectric isolation (BDI) layer 34'. The resulting structure is subjected to a timed wet etching process to selectively recess the silicon germanium layers within the nanosheet stacks. Hydrogen chloride gas is employed in some embodiments to selectively remove silicon germanium, leaving the silicon nanosheet (channel) layers 21 substantially intact. Alternatively, a wet etch process containing ammonia and hydroperoxide can be used to etch SiGe selective to other materials. Each exposed end of the sacrificial silicon germanium layers may be recessed by, for example, three to seven nanometers (3-7 nm). The silicon germanium layers have smaller widths than the widths of the silicon (channel) layers 21 following the timed etch. The stack of semiconductor nanosheet layers accordingly includes indents between the end portions of each pair of silicon (channel) layers 21.

Dielectric spacer material is deposited in the trenches resulting from the reactive ion etch of the stacks of semiconductor nanosheet layers. The dielectric spacer material is etched back to form inner spacers 36 each of the indents in the stacks of nanosheet semiconductor layers. A selective wet etch may be employed to remove the dielectric inner spacer material outside of the indents between silicon layers. The inner spacers 36 of the structure 40, as shown in FIG. 4A, may comprise, for example, low-k dielectric material. Silicon oxynitride, SiBCN (silicon borocarbonitride), SiOCN (silicon oxycarbonitride), and/or SiOC (silicon oxycarbide) inner spacers may be formed in some embodiments. Relatively low-k silicon nitride-based materials, if used to form the inner spacers, can be selectively etched using, for example, phosphoric acid. Various techniques of forming inner spacers for nanosheet transistors have been discussed in the literature and may continue to be developed. The materials and steps discussed with respect to inner spacer formation should accordingly be considered exemplary as opposed to limiting.

Source/drain regions 22P, 22N are epitaxially grown on the exposed edges of the silicon nanosheet channel layers 21. Dopants may be incorporated within the source/drain regions in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. In one or more embodiments, both nFET and pFET regions are formed. Source/drain regions of nanosheet devices are typically grown prior to the RMG (replacement metal gate) process.

FIG. 4A, FIG. 4B, FIG. 4C and FIG. 4D provide views of an exemplary structure 40 obtained following sacrificial gate removal, release of sacrificial silicon germanium nanosheet layers, replacement gate formation, and deposition and planarization of a front side interlevel dielectric layer 38. Process steps for effecting gate replacement, are known to the art and shall accordingly be described briefly below. It will be appreciated that nanosheet transistor formation and the formation of other elements may continue to be developed. The processing steps described for obtaining the structure 40 should accordingly be considered exemplary and not limiting.

The front side interlevel dielectric (ILD) layer 38 may be deposited over the structure using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The front side ILD layer may include, but is not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below. The front side ILD layer comprises multiple layers in some embodiments. The front side ILD layer fills the spaces between the gate spacers 34 and extends down to the top surfaces of the STI regions 32.

The front side ILD layer 38 is planarized down to the top surfaces of a hard mask (not shown). The hard mask and sacrificial gate layer (not shown) are removed from the resulting structure. The sacrificial silicon germanium layers are then selectively removed, leaving stacks of silicon (channel) layers 21 separated by spaces (not shown). Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. Gate stacks 26 are formed in adjoining relation to the nanosheet (channel) layers 21. A gate dielectric layer forms portions of the gate stacks that replace the sacrificial silicon germanium nanosheet layers and adjoins the silicon channel layers 21. Gate metal is deposited over the gate dielectric layer. The gate stacks adjoin the silicon nanosheet channel layers 21, forming a gate-all-around structure.

Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer includes multiple dielectric layers.

Electrically conductive gate material is deposited in the spaces formerly filled by the sacrificial gate and the silicon germanium nanosheet layers. The deposited metal gate material forms the metal gate of the nanosheet field-effect transistors of the resulting structure 40. In some embodiments, the electrically conductive gate includes a work function metal (WFM) layer. WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include, for example, hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process.

In one exemplary embodiment, an n-type WFM layer having a thickness of three nanometers (3 nm) may be formed on the gate dielectric layer. The thickness of the WFM layer may, for example, be in the range of two to ten nanometers (2-10 nm), with thinner layers being used as device scaling decreases. The n-type WFM layer is intended for use in association with the n-type transistors. Portions of the n-type WFM layer that may also be deposited in the pFET region may accordingly be replaced later in the process. The n-type WFM layer and the gate dielectric may fill the spaces between the silicon channel layers 21 and the regions formerly occupied by the sacrificial gates.

The n-type WFM layer in the nFET region(s) may be protected by a patterned OPL (not shown). Exposed portions of the n-type WFM layer in the pFET region are removed, leaving open spaces between the silicon channel layers 21 within the pFET region. Gate metal is accordingly removed from the pFET region while the protected nFET region remains intact. An SC1 etch or other suitable etch processes can be employed to selectively remove gate metal while leaving the gate dielectric layer substantially intact. The duration of the etch, which is sufficient to allow removal of all gate metal from the pFET region, does not affect the gate metal in the nFET region. Following removal of the originally deposited n-type WFM layer from the pFET region, new gate metal deemed appropriate for the pFET transistors is deposited. A p-type WFM layer is deposited in embodiments wherein the first-deposited metal is n-type. It will be appreciated that the process can be reversed and n-type metal can be deposited subsequent to p-type metal in some alternative embodiments. Metal overburden can be removed using chemical mechanical planarization (CMP). An FEOL (device) layer 45 comprising FETs and possibly other electronic devices (not shown) within the front side ILD layer 38 is accordingly provided.

Referring now to FIG. 5A, FIG. 5B, FIG. 5C and FIG. 5D, a hard mask 42 is deposited on the structure and patterned. A gate cut trench 44 is formed within the gate stack 26 and the front side ILD layer 38. The gate cut trench(es) is vertically aligned with the opening(s) formed in the hard mask 42 and extends down to the STI region 32, as illustrated in FIG. 5B and FIG. 5C. End portions of the metal gate portions of the gate stack 26 form opposing vertical walls of the gate cut trench 44. The field-effect transistors on opposing sides of the gate cut trench 44 are electrically isolated from each other in the resulting structure 50.

A dielectric liner 46 is formed on the vertical and horizontal surfaces bounding the gate cut trench 44. In other words, the dielectric liner 46 adjoins the vertical end portions of the metal gate portions of the gate stacks 26 on each side of the gate cut trench and the top surface of the underlying STI region 32. It will be appreciated that the end portions may not be entirely vertical. Formation of the dielectric liner 46 is followed by deposition of a dielectric fill 48 and CMP. The dielectric liner 46 and dielectric fill 48 comprise different dielectric materials that will allow for selective etching thereof. The dielectric liner 46 may comprise, for example, SiN, SiOC, SiC and can be deposited using atomic layer deposition (ALD) to a thickness between five and fifteen nanometers (5-15 nm). The dielectric fill may comprise silicon dioxide ($SiO_2$) or a low-k oxide and can be deposited by ALD, CVD, PVD or other suitable techniques. The dielectric liner and dielectric fill are polished together once both have been deposited. The dielectric liner and dielectric fill within the gate cut trench comprise a gate cut region that electrically isolates the devices on opposite sides of the gate cut region. A structure 60 as illustrated in FIG. 6A, FIG. 6B, FIG. 6C and FIG. 6D is obtained following planarization thereof down to the top surfaces of the gate stack 26 and front side ILD layer 38.

Silicon-based devices typically include multiple interconnect metallization layers above a device (front-end-of-line/FEOL) layer 45 that contains field-effect transistors (FETs) and/or other electronic structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. A middle-of-line (MOL) ILD layer 38' is formed on the structure, planarized and then patterned. The MOL ILD layer 38' may have the same composition(s) as the front side interlevel dielectric (ILD) layer 38 and be deposited using the same techniques. A first set of openings 52 formed within the MOL ILD layer 38' extend down to the top surfaces of selected source/drain regions 22P, 22N, as illustrated in FIG. 7A and FIG. 7C. Other source/drain regions remain protected by the ILD layers thereon. An exemplary structure 70 including a first set of openings 52 for front side metal source/drain contacts is illustrated in FIG. 7A, FIG. 7B, FIG. 7C and FIG. 7D.

An organic planarization layer (OPL) 54 is deposited over the MOL ILD layer 38' and fills the openings 52 aligned with the selected source/drain regions. The OPL is patterned, thereby exposing selected portions of the MOL ILD layer 38'. Using the patterned OPL, the MOL ILD layer 38' is subjected to further etching to provide a second set of openings that are aligned with the top surfaces of the gate stacks 26. Portions of the gate metal portions of the gate stacks are exposed following the gate contact patterning of the MOL ILD layer 38', as shown in FIG. 8B. The second set of openings may be described as gate contact openings 56, 56'. Some of the gate contact openings are aligned entirely with the top surfaces of the gate stacks 26 in the exemplary embodiment, as shown in FIG. 8B and FIG. 8D. One or more of the gate contact openings 56' in the exemplary embodiment are vertically aligned with edge portion(s) of the gate stacks, which are protected by the dielectric liner 46 at this stage of the process. Such gate contact openings 56' extend partially over the gate cut region comprising the dielectric liner 46 and the dielectric fill 48. As best shown in FIG. 8B, top surfaces of the gate stack 26, the dielectric liner 46, and the dielectric fill 48 are exposed at the bottom of one of the gate contact openings (56'). The other (56) of the gate contact openings shown in the figure exposes only metal gate material. FIG. 8A, FIG. 8B, FIG. 8C and FIG. 8D illustrate an exemplary structure 80 obtained following gate contact patterning.

Figures 9A, 9B, 9C:
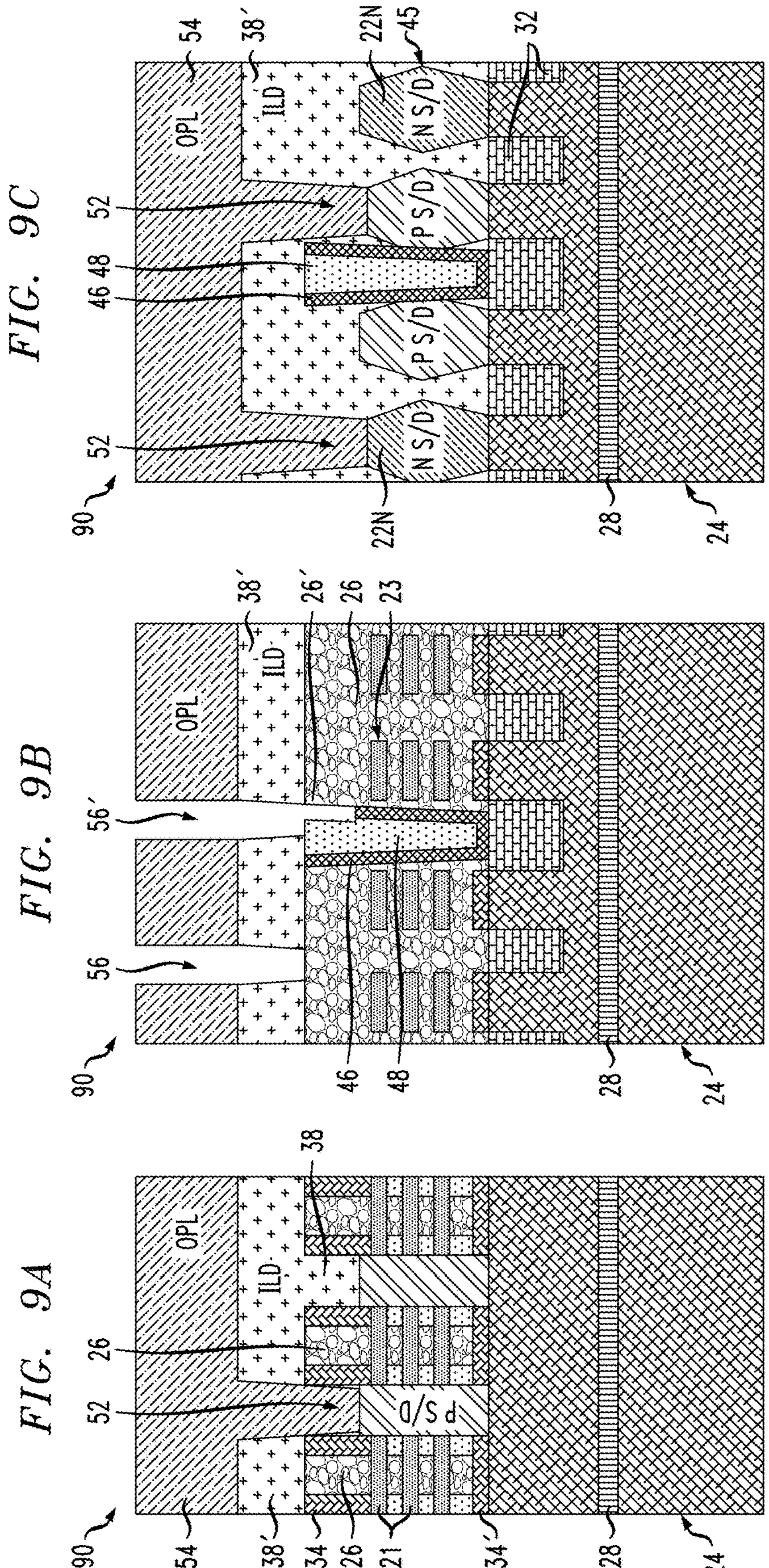
FIGS. 9A, 9B, and 9C are views of the structure of FIGS. 8A, 8B, and 8C following selective removal of a portion of the dielectric liner, thereby exposing an edge portion of a metal gate.

A selective etch is employed to remove a portion of the dielectric liner 46 exposed by the gate contact opening(s) 56'. The etch is selective with respect to the dielectric fill and the metal gate material. In one exemplary embodiment, a conventional plasma dry etch process is employed for selective etching. The etch is timed such that dielectric liner material remains between the silicon channel region (and the adjoining portion of the gate stack) and the dielectric fill within the gate cut region. As shown in FIG. 9B, a top portion of the dielectric liner 46 on one side of the gate cut trench is removed, thereby vertically extending the gate contact opening 56' and exposing metal gate material on a vertical end portion 26' of the gate stack 26. The extended portion of the gate contact opening 56' may be slightly wider than the thickness of the dielectric liner 46 as surface portions of the metal and/or dielectric fill 48 forming the sidewalls of the extended portion may also be removed to a small extent during the selective etch. The portions of the gate stack 26 adjoining the semiconductor channel layers 21 continue to be lined by the remaining portion of the dielectric liner 46 as the selective etch is discontinued prior to removing dielectric liner material below the level of the tops of the channel regions. A structure 90 as shown in FIG. 9A, FIG. 9B and FIG. 9C is obtained following the further selective etching of the dielectric liner 46.

The OPL 54 is removed from the structure by ashing or other suitable process followed by source/drain contact and gate contact metallization. Top (frontside) source/drain contacts 58-1 can comprise electrically conductive material including, but not limited to, a silicide layer such as Ti, Ni, NiPt, and a metal adhesion layer, such as TiN, TaN and conductive metal fills, such as tungsten (W), aluminum (Al), copper (Cu), cobalt (Co), ruthenium (Ru), molybdenum (Mo), or any other suitable conductive material, and combinations thereof. A metal silicide layer can be formed on the source/drain regions 22N, 22P by depositing a metal liner such as a titanium liner thereon prior to deposition of the metal fill layers. Such a titanium liner can be deposited using physical vapor deposition (PVD), and is followed by annealing at a temperature between about two hundred and eight hundred degrees Centigrade to form the metal silicide. The structure may be annealed to form a metal silicide layer between the contact metal and the source/drain epitaxy. Each front source/drain contact 58-1 forms an electrical connection to one of the source/drain regions 22N, 22P. Gate contacts 62, 62' are also formed on the front side of the device layer. The gate contacts and the front side source/drain contacts may or may not be formed at the same time and may or may not comprise the same electrically conductive material(s).

As shown in the exemplary structure 110 depicted in FIG. 10B, one of the gate contacts 62 fills the gate contact opening 56 within the MOL ILD layer 38' and contacts only the top surface of a gate stack 26. The gate contact 62' filling the other of the two illustrated gate contact openings (56') extends vertically within MOL ILD layer 38' and the gate cut region. It is accordingly in direct contact with the vertical end portion 26' of a gate stack 26 that adjoins the gate cut region. It may further contact a top surface of the gate stack 26 that adjoins the vertical edge portion 26' thereof. Each gate contact 62' includes a top portion within the MOL ILD layer 38' and a bottom portion extending within the gate cut region. The bottom portion of the gate contact 62' is bounded laterally by the metal gate portion of the gate stack 26 and the dielectric fill 48 and at the bottom thereof by a top surface of the dielectric liner 46. The top portion of the gate contact 62' in the exemplary structure has a greater width than the bottom portion thereof. The surfaces of the gate stacks that are exposed prior to contact metallization are sufficient to ensure effective electrical connections between the gate stacks 26 and the gate contacts 62, 62'.

Figures 11A, 11B, 11C:
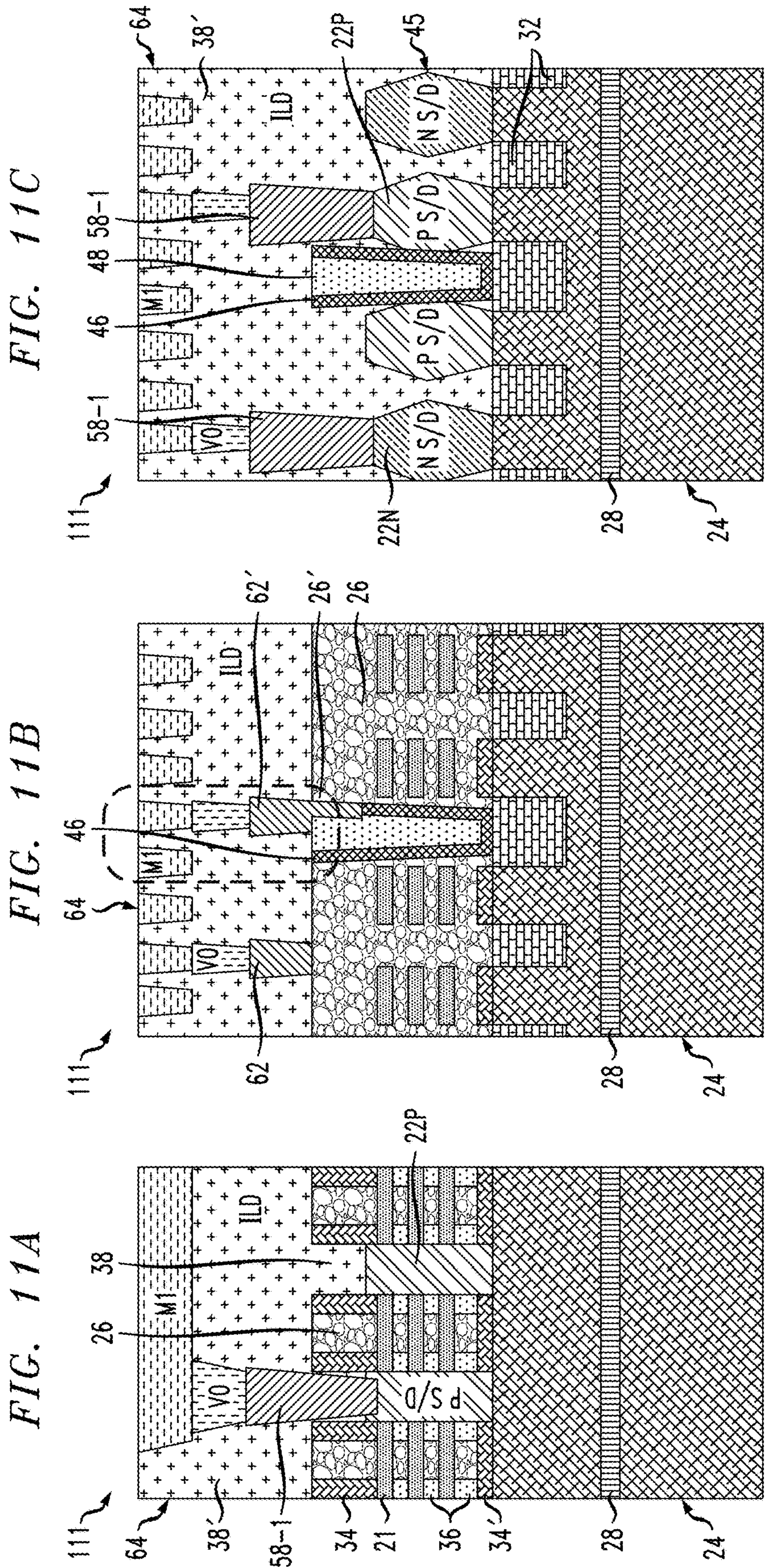
FIG. 11A is a schematic, cross-sectional view thereof corresponding to the structure shown in FIG. 10A following formation of a first metal layer and vias connecting the first metal layer to selected contacts.
FIG. 11B is a further schematic, cross-sectional view thereof.
FIG. 11C is a further schematic, cross-sectional view thereof.

Additional MOL ILD material is deposited over the structure 110 and patterned. The same reference numeral (38') is employed to identify the previously deposited MOL ILD layer as well as the additional material deposited thereon. A metal wiring layer 64 (M1) is formed within the patterned MOL ILD material and includes tracks for electrically connecting the front side source/drain contacts and gate contacts with a BEOL layer(s) to be formed above the MOL ILD layer. As shown in the rectangle formed by the dashed lines in FIG. 11B, the placement of the gate contact 62' at the gate edge allows the use of two signal tracks of the M1 metal wiring layer 64 for gate signals. The two signal tracks are vertically aligned with the gate cut region. As shown in FIG. 11A and FIG. 11C, the M1 metal wiring layer is also electrically connected to the front side source/drain contacts 58-1 of the resulting structure 111.

Back-end-of-line (BEOL) processing involves the creation of metal interconnecting wires that connect the devices formed in FEOL processing to form electrical circuits and may include silicidation as discussed above with respect to MOL processing. Metal interconnecting wires that connect the devices in the FEOL (device) layer 45, thereby forming electrical circuits, are formed within one or more BEOL layers 65 following MOL processing. The BEOL layers are formed over the front side of the device layer 45. The metal lines including the interconnecting wires in the BEOL layers are deposited in sequence over the device layer 45 and include dielectric layers. The interconnecting wires within each metal line are electrically connected to interconnecting wires in other metal lines and to the devices in the FEOL (device) layer 45. BEOL processing typically includes low-temperature steps for forming metal wires and preserving temperature sensitive FEOL and MOL structures. BEOL processing involves the formation of interconnect layers above the MOL layer(s). A chip may have multiple BEOL interconnect layers. Each interconnect layer, which has a wiring scheme, is connected to another interconnect layer by vias. The wires and vias are within dielectric layers, one or more of which may comprise low-k material.

Figures 12A, 12B, 12C:
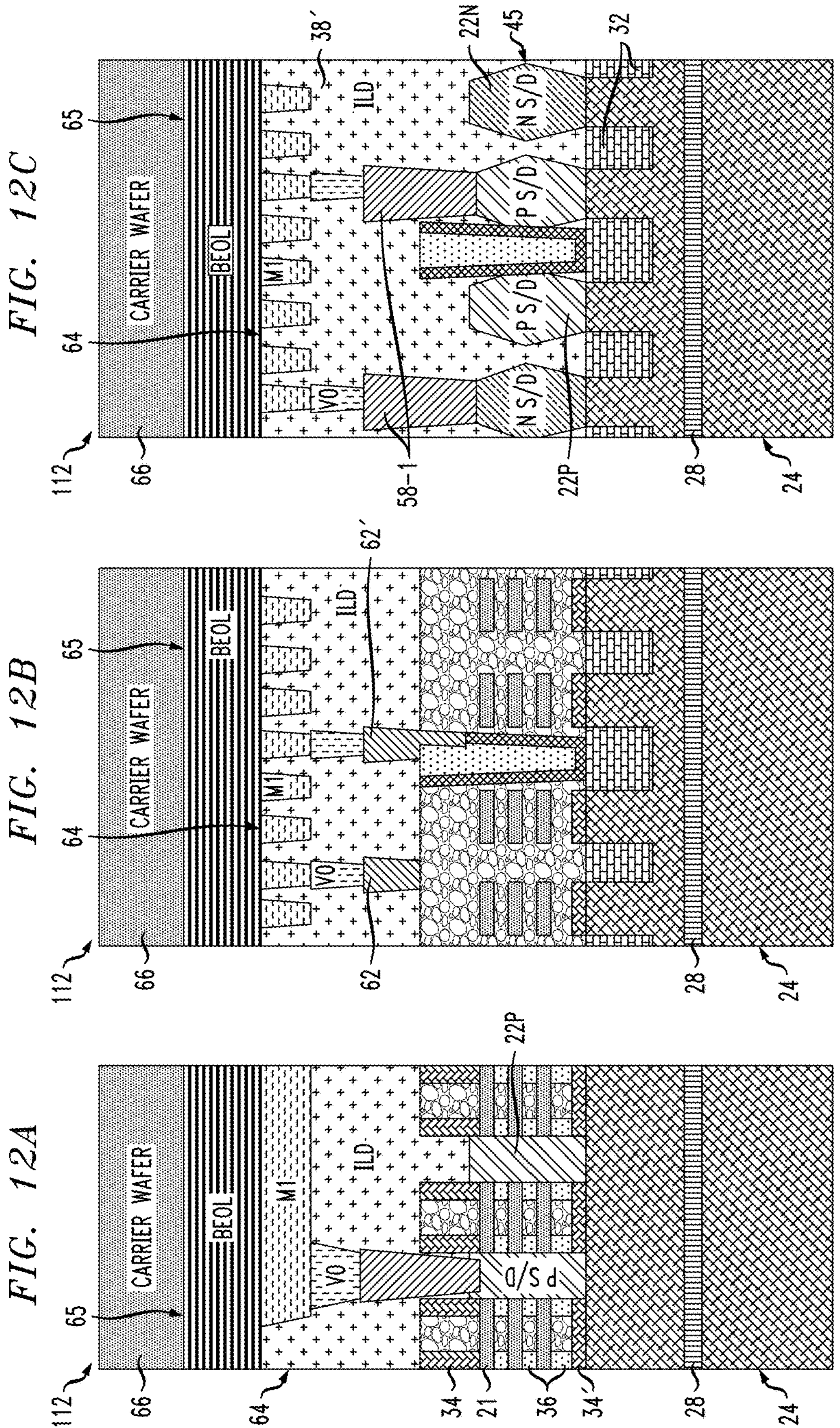
FIG. 12A is a schematic, cross-sectional view corresponding to the structure shown in FIG. 11A following formation of further back-end-of-line metal layers and bonding of a carrier wafer.
FIG. 12B is a further schematic, cross-sectional view thereof.
FIG. 12C is a further schematic, cross-sectional view thereof.

A carrier wafer 66 is bonded to the resulting structure above the BEOL layer(s) 65. A bonding oxide layer may be deposited on each of the top BEOL layer and the carrier wafer. The carrier wafer is bonded to the BEOL layers by the bonding oxide layers and form a bonding oxide layer. An exemplary monolithic semiconductor structure 112 shown in FIG. 12A, FIG. 12B, and FIG. 12C includes an FEOL (device) layer 45 comprising nFET and pFET transistors, optionally other electronic devices, an MOL layer comprising front side source/drain and gate contacts 58-1, 62, 62', and BEOL layer(s) 65 electrically connected to the devices in the device layer. Some of the source/drain regions in the exemplary structure are not associated with front side source/drain contacts. The structure 112 further includes a carrier wafer 66. The gate cut region comprising dielectric material provides a cell boundary that electrically isolates regions of transistors. Location of gate contact(s) in this region facilitate use of the M1 tracks within the M1 metal wiring layer 64 as signal tracks.

Figures 13A, 13B, 13C:
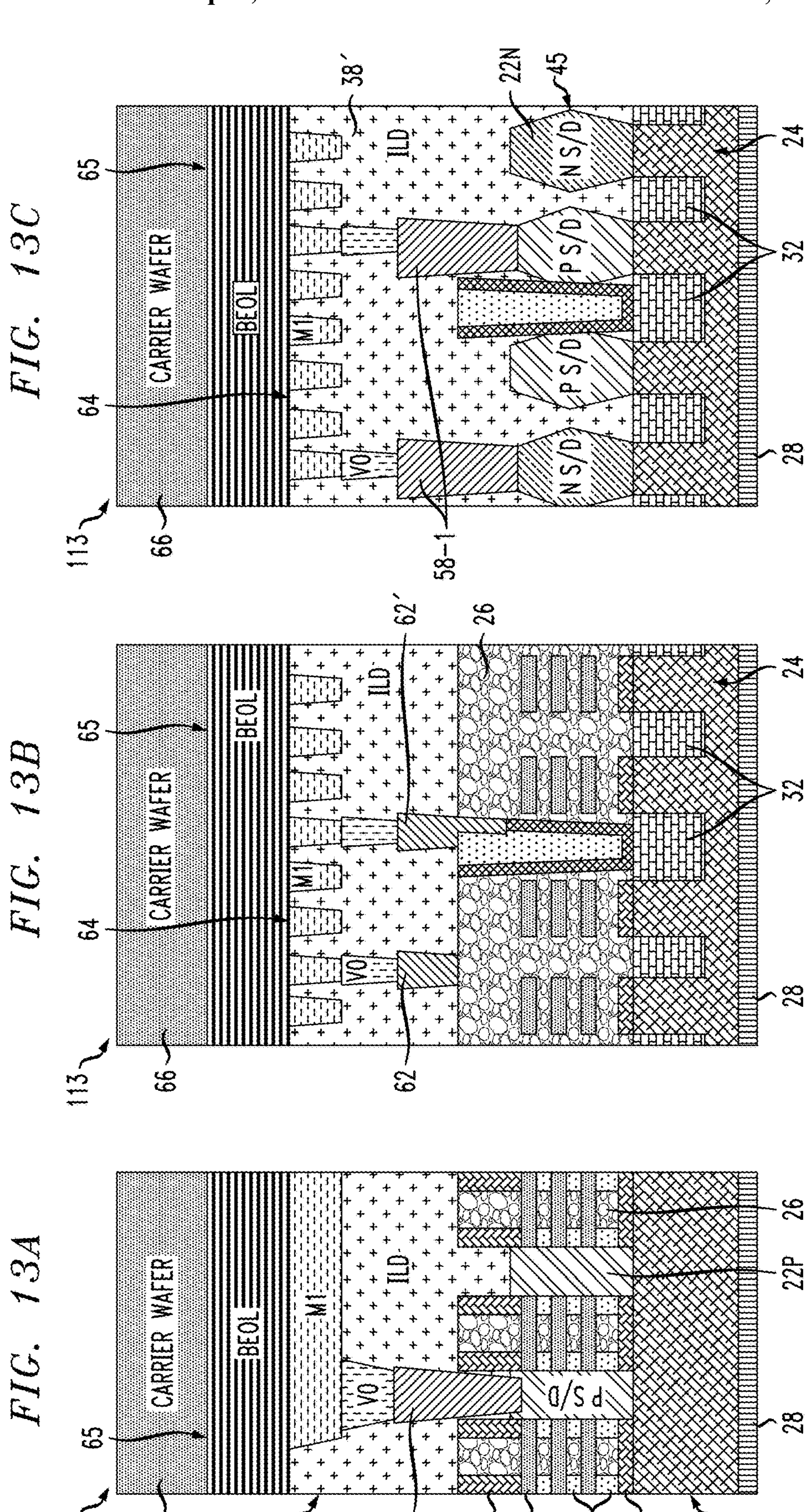
FIG. 13A is a schematic, cross-sectional view corresponding to the structure shown in FIG. 12A following substrate removal.
FIG. 13B is a further schematic, cross-sectional view thereof.
FIG. 13C is a further schematic, cross-sectional view thereof.

The structure 112 is flipped and the portion of the silicon substrate layer 24 beneath the etch stop layer 28 is removed therefrom. A substrate grinding, chemical mechanical polishing (CMP) and selective wet process may be performed at this stage of the process. Ammonium hydroxide ($NH_4OH$) or tetramethylammonium hydroxide (TMAH) may be employed for wet process as their selectivity to silicon germanium is high. (As indicated above, the etch stop layer may comprise silicon germanium.) A monolithic structure 113, as illustrated in FIG. 13A, FIG. 13B and FIG. 13C may be obtained.

Figures 14A, 14B, 14C:
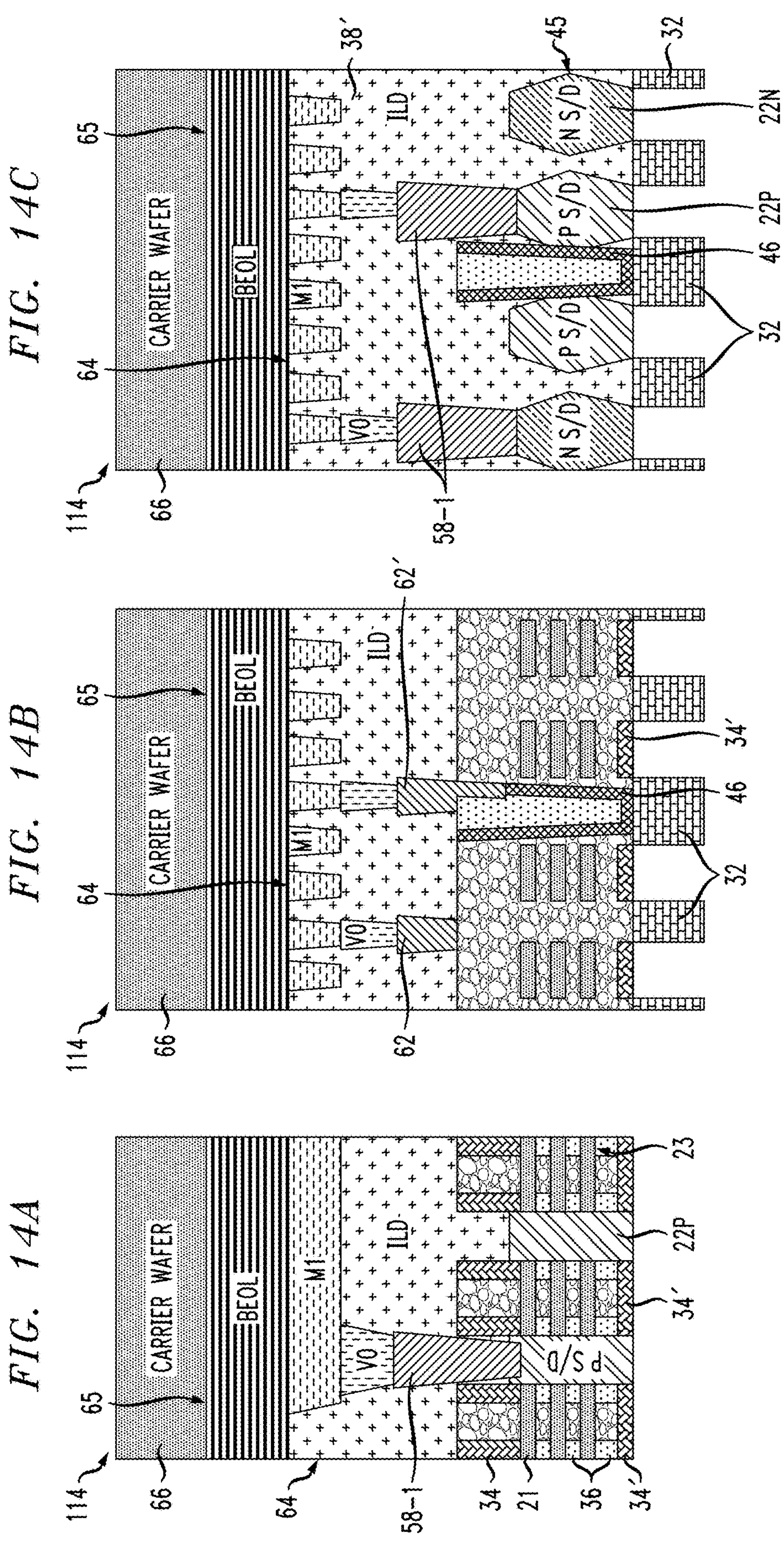
FIG. 14A is a schematic, cross-sectional view corresponding to the structure shown in FIG. 13A following etch stop layer and silicon removal therefrom.
FIG. 14B is a further schematic, cross-sectional view thereof.
FIG. 14C is a further schematic, cross-sectional view thereof.

The etch stop layer 28 and the portion of the silicon substrate layer 24 beneath the BDI layer 34' are selectively removed, thereby obtaining a structure 114 (shown front side up) as illustrated in FIG. 14A, FIG. 14B and FIG. 14C. The BDI layer 34' protects the metal gate during this stage of the process.

Figures 15A, 15B, 15C:
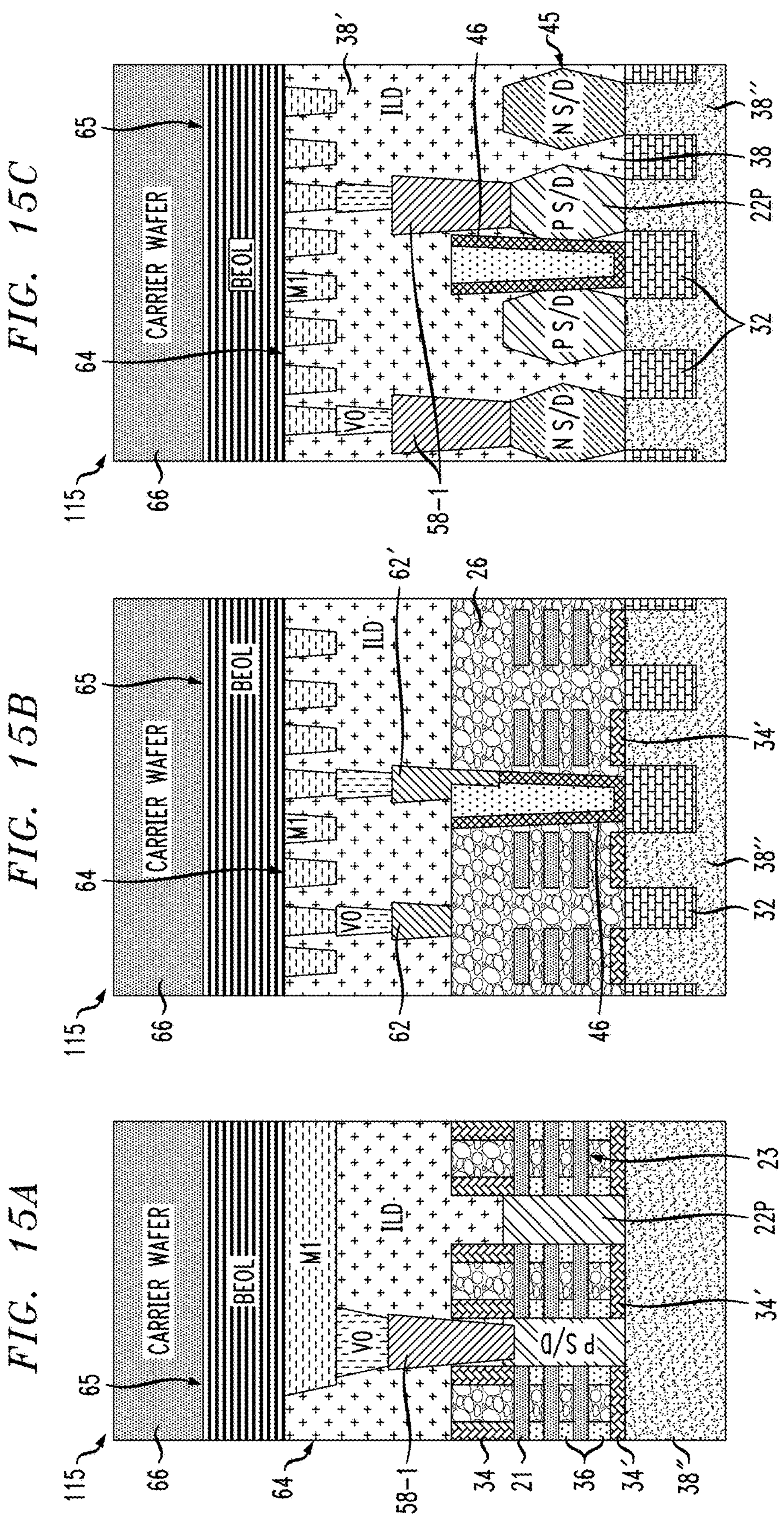
FIG. 15A is a schematic, cross-sectional view thereof corresponding to the structure shown in FIG. 14A following deposition of a backside interlevel dielectric layer (BILD)
FIG. 15B is a further schematic, cross-sectional view thereof.
FIG. 15C is a further schematic, cross-sectional view thereof.

A back side ILD (BILD) layer 38" is deposited on the inverted structure 114 and planarized. Though not required, the back side ILD layer 38" may have the same composition(s) as the previously formed ILD layers on the front side of the device layer, as discussed above. An exemplary structure 115 as shown in FIG. 15A, FIG. 15B and FIG. 15C may be obtained.

The back side ILD layer 38" is patterned, thereby exposing the back surfaces of selected source/drain regions 22N, 22P. Back side contact metallization is followed by metal overburden removal to form back side source/drain contacts 58-2. The back side contacts contact the back side (bottom) surfaces of selected source/drain regions 22N, 22P. The back side source/drain contacts may or may not comprise the same metal(s)/metal silicide(s) used to form the front side source/drain contacts 58-1. It will be appreciated that the "back side" surfaces are at the top of the structure during back side metallization following wafer flip as discussed above. The back side source/drain contacts 58-2 extend within the back side ILD layer 38" and are also bounded by STI regions 32.

Back side interconnect structure(s) are formed over the back side ILD layer 38". In some embodiments, the back side interconnect structure(s) include a back side power rail incorporated within a back side power delivery network (BSPDN) 75. The back side source/drain contacts 58-2 are electrically connected to the back side interconnect structure comprising the BSPDN and possible other back side structures.

A monolithic semiconductor structure 116 can be obtained using fabrication techniques as discussed above. The monolithic semiconductor structure 116 includes a device layer 45 formed in FEOL processing and has a front side and a back side. Field-effect transistors and possibly other electronic devices (not shown) are incorporated within the device layer. The device layer 45 includes FETs comprising channel regions (stacked silicon channel layers 21 in the exemplary structure), source/drain regions 22N, 22P extending laterally from the channel regions, and gate stacks 26, all of which are embedded within an ILD layer. A back-end-of-line interconnect layer 65 is positioned over the front side of the device layer 45 and is electrically connected to the field-effect transistors. Front side source/drain contacts 58-1 adjoin the top surfaces of selected source/drain regions. The front side source/drain contacts are employed to electrically connect selected source/drain regions to the M1 metal wiring layer 64 and the BEOL layer(s). Back side source/drain contacts 58-2 adjoin the back side surfaces of other selected source/drain regions. The back side source/drain contacts are employed to electrically connect selected source/drain regions with a back side interconnect structure such as a back side power delivery network 75.

Figures 16A, 16B, 16C:
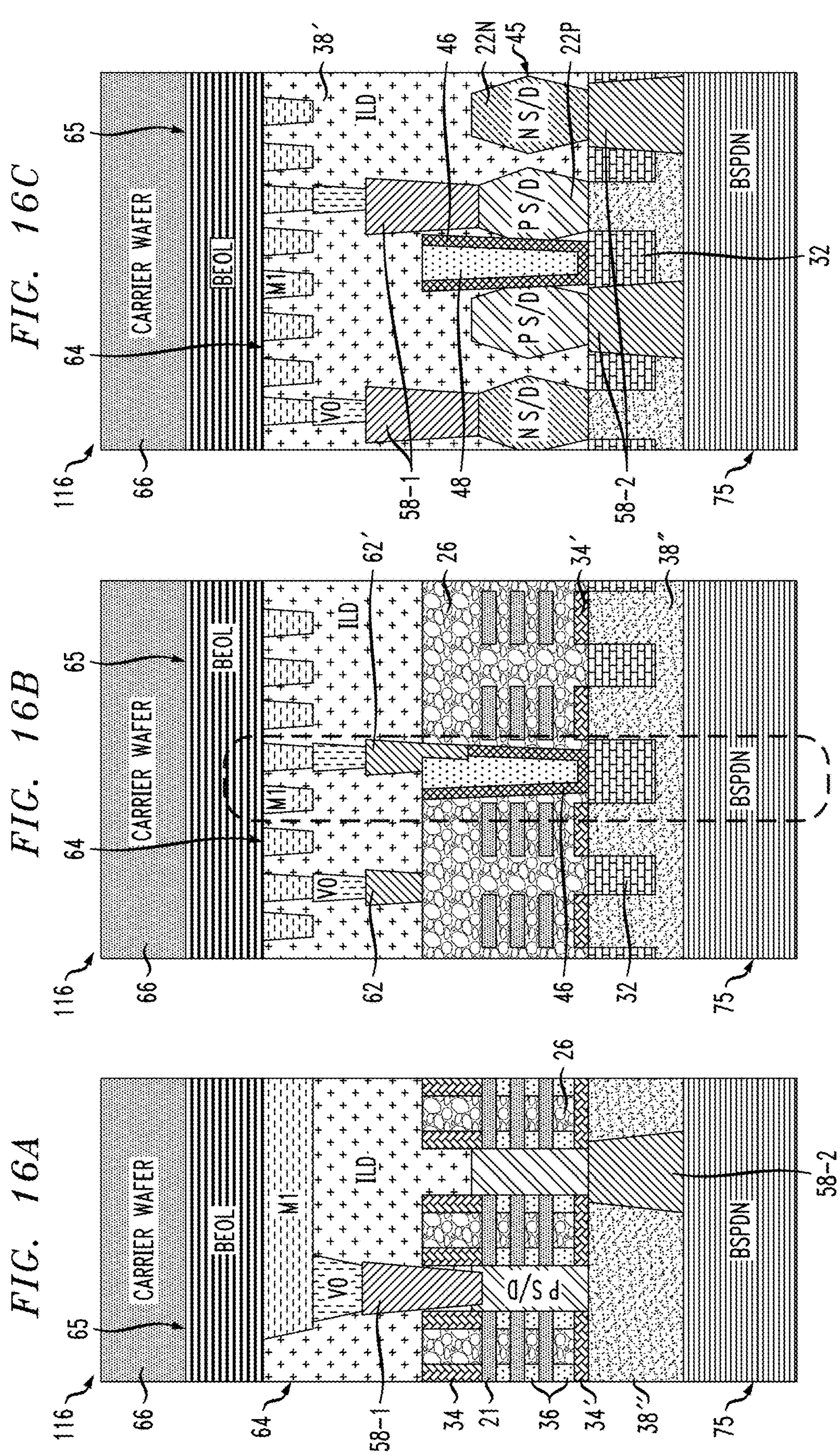
FIG. 16A is a schematic, cross-sectional view corresponding to the structure shown in FIG. 15A following backside contact formation and formation of a backside power delivery network.
FIG. 16B is a further schematic, cross-sectional view thereof.
FIG. 16C is a further schematic, cross-sectional view thereof.

Referring the region within the rectangular outline in FIG. 16B, the back side power delivery network 75 obviates the need for M1 power rails at cell boundaries. M1 signal tracks can instead be employed at the cell boundary above the gate cut region. The use of M1 signal tracks is facilitated by gate contact(s) that extend over the vertical edge(s) of gate stack(s) within the gate cut region(s). The gate cut region in the exemplary monolithic semiconductor structure 116 comprises a bi-layer dielectric, the outer layer thereof (dielectric liner 46) contacting the metal gate portion of the gate stack and the inner layer (dielectric fill 48) filling the remainder of the gate cut region. The gate contact 62' extends, in part, over an exposed edge portion of the metal gate portion of the gate stack and between the metal gate portion and the inner (dielectric fill) layer of the gate cut region. In the exemplary embodiment, the gate contact 62' is electrically connected between a signal track within the M1 metal wiring layer 64 and the gate stack 26 of one of the transistors at a cell boundary that electrically isolates transistor groups. The signal track and the gate contact 62' are vertically aligned in the exemplary monolithic semiconductor structure 116.

In some embodiments, a field-effect transistor (or a plurality of FETs) within the device layer 45 includes one source/drain region electrically connected by a front side contact 58-1 to the BEOL layer and another source/drain region electrically connected by a back side contact 58-2 to the backside interconnect layers. Some FETs in the device layer may have source/drain regions that are electrically connected only to the BEOL interconnect layer by front side contacts.

The exemplary fabrication process, which includes the use of two different dielectric materials within the gate cut region, facilitates gate contact metallization that results in the extension of a gate contact 62' within the gate cut region in adjoining relation to a vertically extending surface of gate metal. The partial etch of the dielectric liner 46 that adjoins both the gate metal and the dielectric fill 48 provides an effective and practical way to form a gate contact for electrical connection to an M1 signal line.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, FET devices and gate contacts formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, various features may be grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic semiconductor structure, comprising:

a device layer including:

a first field-effect transistor comprising a channel region, a gate stack adjoining the channel region, the gate stack including a metal gate portion and a gate dielectric layer between the metal gate portion and the channel region, and source/drain regions extending from the channel region;

a gate cut region comprising a first vertical side wall and a second vertical side wall in opposing relation to the first vertical side wall, the first vertical side wall comprising an end portion of the metal gate portion of the first field-effect transistor, the second vertical side wall comprising an end portion of a second gate metal portion of a second field-effect transistor; and dielectric material within the gate cut region, the dielectric material adjoining the first vertical side wall and the second vertical side wall of the gate cut region; and a gate contact having a bottom portion extending within the gate cut region and positioned between the first vertical side wall of the gate cut region and the dielectric material, the bottom portion being in direct contact with the metal gate portion of the first field-effect transistor, the gate contact further including a top portion extending above the gate stack.

2. The monolithic semiconductor structure of claim 1, wherein the dielectric material within the gate cut region comprises:

a dielectric fill comprising a first dielectric compound; and a dielectric liner between the metal gate portion of the first field-effect transistor and the dielectric fill, the dielectric liner comprising a second dielectric compound, the second dielectric compound having a different composition than the first dielectric compound, wherein the bottom portion of the gate contact adjoins a top surface of the dielectric liner.

3. The monolithic semiconductor structure of claim 2, further including:

a middle-of-line interlevel dielectric layer above the device layer;

a metal layer comprising signal tracks within the middle-of-line interlevel dielectric layer, the gate contact being electrically connected to one of the signal tracks; and a back-end-of-line wiring layer above the metal layer, the back-end-of-line wiring layer being electrically connected to the device layer.

4. The monolithic semiconductor structure of claim 3, further including:

a back side power delivery network below the device layer, the back side power delivery network being electrically connected to the device layer.

5. The monolithic semiconductor structure of claim 4, wherein the channel region comprises a stack of nanosheet semiconductor layers.

6. The monolithic semiconductor structure of claim 5, further including:

a back side contact electrically connecting one of the source/drain regions with the back side power delivery network.

7. The monolithic semiconductor structure of claim 6, wherein the top portion of the gate contact has a greater width than the bottom portion of the gate contact.

8. The monolithic semiconductor structure of claim 6, wherein the back side power delivery network includes a back side power rail.

9. A monolithic semiconductor structure, comprising:

a device layer including a front side and a back side, the device layer comprising:

field-effect transistors within a front side interlevel dielectric layer, each of the field-effect transistors including a channel region, a gate stack adjoining the channel region, and first and second source/drain regions extending laterally from the channel region;

a gate cut region between a first gate stack of a first one of the field-effect transistors and a second gate stack of a second one of the field-effect transistors;

a dielectric fill within the gate cut region, the dielectric fill comprising a first dielectric compound;

a dielectric liner within the gate cut region and adjoining the first gate stack, the second gate stack, and the dielectric fill, the dielectric liner comprising a second dielectric compound, the second dielectric compound having a different composition than the first dielectric compound;

a back-end-of-line interconnect layer over the front side of the device layer, the back-end-of-line interconnect layer being electrically connected to the device layer;

a metal layer between the device layer and the back-end-of-line interconnect layer, the metal layer comprising signal tracks within a middle-of-line interlevel dielectric layer; and a gate contact electrically connecting one of the first gate stack and the second gate stack to a first signal track within the metal layer, the gate contact comprising:

a bottom portion extending within the gate cut region and directly contacting one of the first gate stack and the second gate stack, the bottom portion of the gate contact being positioned between a vertical side wall of the one of the first gate stack and the second gate stack and the dielectric fill and adjoining a top surface of the dielectric liner; and a top portion extending vertically from the bottom portion and electrically connected to the first signal track.

10. The monolithic semiconductor structure of claim 9, further including:

a back side power delivery network over the back side of the device layer; and back side source/drain contacts comprising metal, each of the backside source/drain contacts directly contacting, respectively, one of the first and second source/drain regions of one of the field-effect transistors and being electrically connected to the back side power delivery network.

11. The monolithic semiconductor structure of claim 10, wherein the top portion of the gate contact has a greater width than the bottom portion of the gate contact.

12. The monolithic semiconductor structure of claim 11, wherein the channel region of each of the field-effect transistors comprises a stack of nanosheet semiconductor layers.

13. The monolithic semiconductor structure of claim 11, further including a back side interlevel dielectric layer adjoining the back side of the device layer and shallow trench isolation regions extending within the back side interlevel dielectric layer, the dielectric liner adjoining one of the shallow trench isolation regions.

14. The monolithic semiconductor structure of claim 13, further including:

a bottom dielectric isolation layer beneath the channel region of each of the field-effect transistors.

15. The monolithic semiconductor structure of claim 14, wherein the first signal track is vertically aligned with the gate cut region.

16. The monolithic semiconductor structure of claim 14, wherein the back side power delivery network includes a back side power rail.

17. A method of forming a gate contact for a field-effect transistor, comprising:

obtaining a device layer comprising a plurality of transistor channel regions and a gate stack extending across the transistor channel regions, the gate stack comprising a metal gate portion and a gate dielectric layer between the metal gate portion and the transistor channel regions;

forming a gate cut trench through the gate stack;

forming a dielectric liner within the gate cut trench;

forming a dielectric fill within the gate cut trench over the dielectric liner;

forming a middle-of-line interlevel dielectric layer over the device layer;

patterning the middle-of-line interlevel dielectric layer, thereby forming a gate contact opening over a portion of the gate cut region;

selectively recessing the dielectric liner with respect to the dielectric fill, thereby exposing a vertical end portion of the gate stack and forming a space extending downwardly from the gate contact opening and between the dielectric fill and the vertical end portion of the gate stack; and filling the gate contact opening and the space with contact metal.

18. The method of claim 17, wherein forming the gate cut trench further includes causing the gate cut trench to extend down to a shallow trench isolation region and wherein forming the dielectric liner further includes causing the dielectric liner to extend across the shallow trench isolation region.

19. The method of claim 17, further including:

forming a metal layer comprising signal tracks over the device layer;

electrically connecting the gate contact with one of the signal tracks; and forming a back-end-of-line wiring layer over the metal layer.

20. The method of claim 19, further including:

forming a source/drain contact forming a back side power delivery network beneath the device layer; and electrically connecting the back side power delivery network to the device layer using the source/drain contact.

* * * * *